(12) United States Patent
Chuang et al.

(10) Patent No.: US 12,369,327 B2
(45) Date of Patent: Jul. 22, 2025

(54) MFM DEVICE WITH AN ENHANCED BOTTOM ELECTRODE

(71) Applicant: Taiwan Semiconductor Manufacturing Company, Ltd., Hsinchu (TW)

(72) Inventors: Harry-Hak-Lay Chuang, Zhubei (TW); Fu-Chen Chang, New Taipei (TW); Tzu-Yu Chen, Kaohsiung (TW); Sheng-Hung Shih, Hsinchu (TW); Kuo-Chi Tu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 493 days.

(21) Appl. No.: 17/705,653

(22) Filed: Mar. 28, 2022

(65) Prior Publication Data
US 2023/0329001 A1    Oct. 12, 2023

(51) Int. Cl.
*H10B 53/30*    (2023.01)

(52) U.S. Cl.
CPC ................... *H10B 53/30* (2023.02)

(58) Field of Classification Search
CPC ..................................................... H10B 53/30
See application file for complete search history.

(56) References Cited

U.S. PATENT DOCUMENTS

| 6,307,731 | B1 | 10/2001 | Katori |
| 6,573,150 | B1* | 6/2003 | Urdahl ............. H01L 21/02186 |
| | | | 438/785 |
| 2015/0380480 | A1 | 12/2015 | Ozawa et al. |
| 2016/0172365 | A1 | 6/2016 | McKinnon et al. |
| 2021/0035992 | A1* | 2/2021 | Chen ..................... H10B 53/00 |
| 2022/0045062 | A1 | 2/2022 | Saeei Vahdat et al. |
| 2023/0055097 | A1* | 2/2023 | Morishita ............ H10N 30/074 |
| 2023/0171966 | A1* | 6/2023 | Chang ................. H01L 23/5283 |
| | | | 257/295 |

OTHER PUBLICATIONS

U.S. Appl. No. 17/370,144, filed Jul. 8, 2021.

* cited by examiner

*Primary Examiner* — Yu-Hsi D Sun
(74) *Attorney, Agent, or Firm* — Eschweiler & Potashnik, LLC

(57) ABSTRACT

The present disclosure relates to a ferroelectric memory device that includes a bottom electrode, a ferroelectric structure overlying the bottom electrode, and a top electrode overlying the ferroelectric structure where the bottom electrode includes molybdenum.

20 Claims, 13 Drawing Sheets

MFM DEVICE WITH AN ENHANCED BOTTOM ELECTRODE

BACKGROUND

Many modern day electronic devices contain electronic memory configured to store data. Electronic memory may be volatile memory or non-volatile memory. Volatile memory stores data when it is powered, while non-volatile memory is able to store data when power is removed. Ferroelectric random-access memory (MFM) devices are one promising candidate for a next generation non-volatile memory technology. This is because MFM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
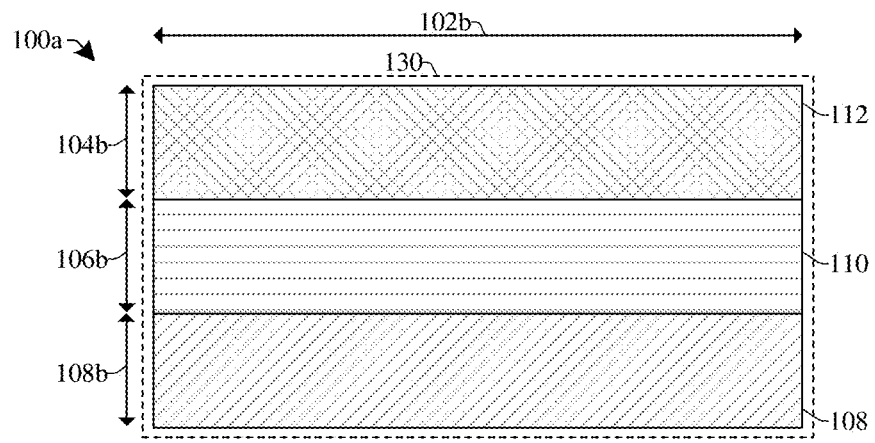
FIG. 1A illustrates a cross-sectional view of some embodiments of a metal-ferroelectric-metal (MFM) device with an enhanced bottom electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-ferroelectric-metal (MFM) device can have a bottom electrode separated from a top electrode by a ferroelectric structure. The bottom and top electrodes are formed of titanium nitride, platinum, aluminum copper, gold, titanium, tantalum, tantalum nitride (e.g., $Ta_xN_y$), tungsten, tungsten nitride, or alloys or combinations of the foregoing. The ferroelectric structure has a remanent polarization switchable between a first state and a second state by application of appropriate voltages across the ferroelectric structure. The different polarities provide the MFM device with different capacitances that may be used to represent different data states (e.g., a logical '0' or '1'), whereby the MFM device may store data.

To read the MFM device, the MFM device may be electrically coupled to a gate electrode of a field-effect transistor (FET). A read voltage may then be applied to the gate electrode through the MFM device. Depending on the state of the remanent polarization, the FET changes between a low threshold voltage and a high threshold voltage. The read voltage is midway between the low and high threshold voltages, such that the FET selectively conducts depending on the state of the remanent polarization. Therefore, the data state of the MFM device may be determined from the conductivity of the FET. The difference between the low and high threshold voltages forms a memory window. The larger the difference between the remanent polarization in the first and second states, the larger the memory window. Further, the larger the memory window, the more reliable read operations are.

A challenge with the MFM device is that oxygen vacancies or traps cluster in the ferroelectric structure. The clusters of oxygen vacancies or traps degrade the remanent polarization and hence the memory window. Further, when the MFM device is manufactured in bulk, the clusters lead to non-uniformity across instances of the MFM device and hence reduce manufacturing yields. As such, the low and high threshold voltages may have large variations across instances of the MFM device.

To mitigate the clustering of oxygen vacancies or traps, a wakeup procedure may be performed. The wakeup procedure applies a plurality of voltage pulses, which may have different voltage amplitudes and/or pulse widths, across the ferroelectric structure. The voltage pulses separate clusters of oxygen vacancies and/or traps in the ferroelectric structure. As such, the wakeup procedure improves the remanent polarization and hence the memory window. Further, the wakeup procedure enhances uniformity and increases manufacturing yields. However, the wakeup procedure is performed by wakeup circuitry, which occupies valuable space on an integrated circuit (IC) chip. Further, the wakeup procedure degrades the life span of the MFM device and hence reduces reliability of the MFM device.

Various aspects of the present disclosure relate to a MFM device with a molybdenum bottom electrode, as well as a method of forming the MFM device. In some embodiments, the MFM device comprises a bottom electrode, a top electrode overlying the bottom electrode, and a ferroelectric structure between the bottom and top electrodes. The bottom electrode is or comprises molybdenum, and the top electrode may or may not comprise molybdenum.

Molybdenum reacts minimally with oxygen when compared to other top/bottom electrode materials (e.g., ruthenium or the like). As such, fewer oxygen vacancies or traps form in the ferroelectric structure while depositing ferroelectric material of the ferroelectric structure. Further, molybdenum is less costly to deposit than ruthenium, platinum, iridium, and other special metals used for electrodes of memory cells.

When the MFM device is manufactured in bulk, fewer oxygen vacancies or traps lead to increased uniformity across instances of the MFM device and hence increase manufacturing yields. Further, fewer oxygen vacancies or traps results in a larger remanent polarization and hence a larger memory window when the MFM device is used for memory. The larger memory window leads to more reliable read operations. Further, the larger memory window enables wakeup-free operation of the MFM device. Because the MFM device may operate wakeup free, costly wakeup circuitry may be avoided. Further, degradation of the ferroelectric structure from a wakeup procedure may be avoided and hence reliability of the MFM device may be increased.

FIG. 1A illustrates a cross-sectional view 100a of some embodiments of a MFM device 130 with an enhanced bottom electrode 108.

The MFM device 130 includes a bottom electrode 108, a ferroelectric structure 110, and a top electrode 112. In some embodiments, the MFM device 130 is used for data storage, whereby the MFM device 130 may also be referred to as a ferroelectric memory device or a memory device. The ferroelectric structure 110 overlies the bottom electrode 108, and the top electrode 112 overlies the ferroelectric structure 110. In some embodiments, an integrated circuit (IC) chip comprises the MFM device 130.

The bottom electrode 108 is formed of an electrode material that minimize formation of oxygen vacancies or traps in the ferroelectric structure 110 while depositing ferroelectric material of the ferroelectric structure 110. Such a minimization is relative to other electrode materials, such as, for example, titanium nitride, platinum, aluminum copper, gold, titanium, tantalum, tantalum nitride, tungsten, tungsten nitride, or alloys or combinations of the foregoing. Further, the top electrode 112 may be or comprise such another electrode material, whereby the minimization may be relative to material of the top electrode 112. In some embodiments, the top electrode 112 if free of molybdenum.

It has been appreciated that molybdenum and compounds of molybdenum are amongst electrode materials that minimize formation of oxygen vacancies or traps. Further, molybdenum is less costly to deposit than ruthenium, platinum, iridium, and other special metals used for electrodes, whereby costs may be reduced through use of molybdenum.

When the MFM device 130 is manufactured in bulk, fewer oxygen vacancies or traps lead to increased uniformity across instances of the MFM device 130 and hence increase manufacturing yields. Further, fewer oxygen vacancies or traps results in a larger remanent polarization and hence a larger memory window when the MFM device 130 is used for memory. The larger memory window leads to more reliable read operations. Further, the larger memory window enables wakeup-free operation of the MFM device 130. Because the MFM device 130 may operate wakeup free, costly wakeup circuitry may be avoided. Further, degradation of the ferroelectric structure 110 from a wakeup procedure may be avoided and hence reliability and a lifespan of the MFM device 130 may be increased.

In some embodiments, the bottom electrode 108 comprises, consists essentially of, or consists of molybdenum or the like. In some embodiments, the bottom electrode 108 comprises, consists essentially of, or consists of one or more of molybdenum sulfide (e.g., $MoS_2$), molybdenum bromide (e.g., $MoBr_3$), molybdenum chloride ($MoCl_2$), molybdenum hexacarbonyl ($Mo(CO)_6$), some other suitable molybdenum compound, or the like. In other embodiments, the bottom electrode 108 is predominantly molybdenum (e.g., the bottom electrode 108 is 80% or more molybdenum by mass, atomic percentage, or the like).

In some embodiments, the electrode material of the bottom electrode 108 is less reactive with oxygen (e.g., depends on more energy to react with oxygen) than other electrode materials, such as, for example, one or more of titanium (Ti), tantalum (Ta), tungsten (W), tantalum nitride (e.g., $Ta_xN_y$), titanium nitride (e.g., TiN), or the like. Further, because the top electrode 112 may be or comprise such another electrode material, the bottom electrode 108 may be less reactive with oxygen relative to the top electrode 112.

In some embodiments the bottom electrode 108 comprises, consists essentially of, or consists of an electrode material with properties including one or more of: 1) a thermal expansion of $5.1E^{-6}$ meter per meter degrees Celsius (m/m/° C.); 2) a density of 10.2 grams per cubic centimeter ($g/cm^3$); 3) or electrical conductivity of $17.9E^6$ siemens per meter (S/m) at 20 degrees Celsius (° C.). In some embodiments, the bottom electrode 108 comprises, consists essentially of, or consists of a material with an oxidation state between −1 and +1. In some embodiments the bottom electrode 108 comprises, consists essentially of, or consists of a material with an oxidation state less than one or more of titanium (Ti), tantalum (Ta), tungsten (W), tantalum nitride (e.g., $Ta_xN_y$), titanium nitride (e.g., TiN), or the like.

The preceding material characterizations, materials, and compositions for the bottom electrode 108 can enable fewer oxygen vacancies or traps in the ferroelectric structure 110 and can hence enable wakeup-free operation of the MFM device 130. As described above, wakeup-free operation may reduce costs and increase a lifespan of the MFM device 130.

In some embodiments, by forming at least the bottom electrode 108 from the preceding material characterizations, materials, and compositions, the ferroelectric structure 110 may, for example, have a remanent polarization ratio that is 1.5 times greater than what it would be if the bottom electrode 108 comprised one or more of Ti, Ta, W, tantalum nitride (e.g., $Ta_xN_y$), titanium nitride (e.g., TiN), or the like. In some embodiments, the remanent polarization ratio is defined as the ratio between capacitances of the MFM device 130 when the remanent polarization is respectively in the first state and the second state, which may, for example, respectively represent data states (e.g., '0' or '1').

In the same or other embodiments, by forming at least the bottom electrode 108 from the preceding material characterizations, materials, and compositions, the memory device formed from the MFM device 130 may, for example, have a memory window that is 1.3 to 1.5 times greater than what it would be if the be if the bottom electrode 108 comprised one or more of Ti, Ta, W, tantalum nitride, titanium nitride, or the like. In some embodiments, the memory window is defined as the difference between a high threshold voltage and a low threshold voltage of a FET with a gate electrode coupled to the bottom electrode 108. When the remanent polarization of the MFM device 130 is in the first state, the FET has the low threshold voltage. When the remanent polarization is in the second state, the FET has the high threshold voltage.

The ferroelectric structure 110 has a remanent polarization that may be switched between a first state and a second state. For example, applying a first voltage across the ferroelectric structure 110, from the bottom electrode 108 to the top electrode 112, may set the remanent polarization to the first state. Further, applying a second voltage with an opposite polarity as the first voltage across the ferroelectric structure 110, from the bottom electrode 108 to the top electrode 112, may set the remanent polarization to the second state. The first and second states of the remanent polarization may be employed to represent a bit of data. The first state of the remanent polarization may represent a first data state (e.g., a '0'), and the second state of the remanent polarization may represent a second data state (e.g., a '1').

In some embodiments, the ferroelectric structure 110 is or comprises lead zirconate titanate (e.g., PZT), strontium bismuth tantalate (e.g., SBT), the like, or any combination of the foregoing. In some embodiments, the ferroelectric structure 110 is or comprises hafnium oxide (e.g., $HfO_2$) doped with silicone, zirconium, yttrium, aluminum, gadolinium, strontium, lanthanum, scandium, germanium, the like, or any combination of the foregoing. In some embodiments, the ferroelectric structure 110 is or comprises hafnium oxide (e.g., $HfO_2$) and/or some other suitable binary oxide(s). In some embodiments, the ferroelectric structure 110 is or comprises hafnium silicate (e.g., $HfSiO_x$), hafnium zirconate (e.g., $HfZrO_x$), barium titanate (e.g., $BaTiO_3$), lead titanate (e.g., $PbTiO_3$), strontium titanate (e.g., $SrTiO_3$), calcium manganite (e.g., $CaMnO_3$), bismuth ferrite (e.g., $BiFeO_3$), aluminum scandium nitride (e.g., AlScN), aluminum gallium nitride (e.g., AlGaN), aluminum yttrium nitride (e.g., AlYN), some other suitable ternary oxide(s), or any combination of the foregoing. In some embodiments, the ferroelectric structure 110 is or comprises barium strontium titanate (e.g., BaSrTiOx) and/or some other suitable quaternary oxide(s).

In some embodiments, the top electrode 112 is or comprises titanium nitride, platinum, aluminum copper, gold, titanium, tantalum, tantalum nitride, tungsten, tungsten nitride, or alloys or combinations of the foregoing. In other embodiments, the top electrode 112 is or comprises the same material as the bottom electrode 108. For example, the top electrode 112 and bottom electrode 108 may each comprise, consist essentially of, or consist of molybdenum, compounds of molybdenum, or the like. Forming the top electrode 112 of a same material as the bottom electrode 108 may further minimize formation of oxygen vacancies or traps in the ferroelectric structure 110 and may hence further enable wakeup-free operation.

In some embodiments, the bottom electrode 108, the ferroelectric structure 110, and the top electrode 112 each have a width 102b that is about 500 to 5000 angstroms, about 500-2750 angstroms, or about 2750-5000 angstroms. If the width 102b is less than about 500 angstroms for the bottom electrode 108, the ferroelectric structure 110, or the top electrode 112, the above described benefits from forming the bottom electrode 108 from an electrode material (e.g., molybdenum or the like) that minimize formation of oxygen vacancies or traps in the ferroelectric structure 110 may be insignificant.

In some embodiments, a top electrode thickness 104b is about 1 to 500 angstroms, about 1-250 angstroms, or about 250-500 angstroms. In some embodiments, a ferroelectric thickness 106b is about 1 to 500 angstroms, about 1-250 angstroms, or about 250-500 angstroms. In some embodiments, a bottom electrode thickness 108b is about 1 to 500 angstroms, about 1-250 angstroms, or about 250-500 angstroms. If the top electrode thickness 104b, the ferroelectric thickness, or the top electrode thickness 104b is less than about 1 angstroms, the above described benefits from forming the bottom electrode 108 from an electrode material (e.g., molybdenum or the like) that minimize formation of oxygen vacancies or traps in the ferroelectric structure 110 may be insignificant.

Figure 1B:
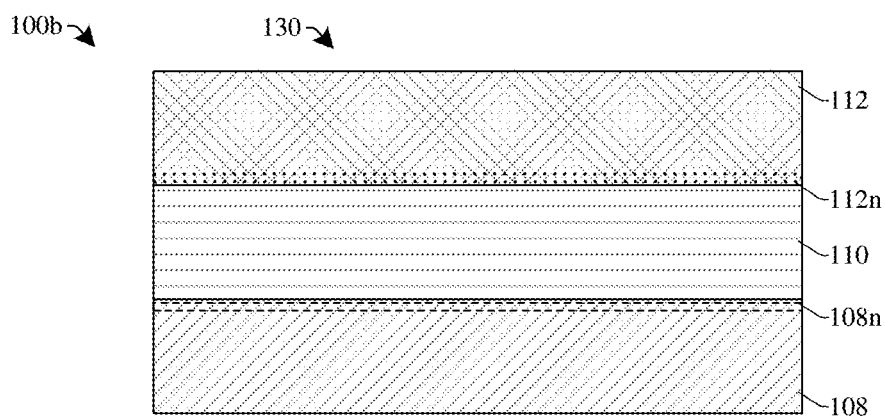
FIG. 1B illustrates a cross-sectional view of some alternative embodiments of the MFM device of FIG. 1A in which the bottom electrode comprises a nitrogen-rich layer along a top surface of the bottom electrode.

FIG. 1B illustrates a cross-sectional view 100b of some alternative embodiments of the MFM device 130 of FIG. 1A in which the bottom electrode 108 comprises a nitrogen-rich layer 108n along a top surface of the bottom electrode 108.

The nitrogen-rich layer 108n has an elevated concentration of nitrogen relative to a remainder of the bottom electrode 108. In some embodiments, the elevated concentration exceeds about $10^{18}$ atoms/cm$^3$, about $10^{15}$ atoms/cm$^3$, or some other suitable concentration. The nitrogen-rich layer 108n may be formed by exposing a top surface of the bottom electrode 108 to nitrogen plasma and/or gas before depositing ferroelectric material of the ferroelectric structure 110.

In some embodiments, the top electrode 112 also has a nitrogen-rich layer 112n along a bottom surface of the top electrode 112 and with an elevated concentration of nitrogen relative to a remainder of the top electrode 112. In some embodiments, the nitrogen-rich layer 108n of the bottom electrode 108 has a higher concentration of nitrogen relative to the nitrogen-rich layer 112n of the top electrode 112. In other embodiments, the top electrode 112 is free of a nitrogen-rich layer 112n along the bottom surface of the top electrode 112.

It has been appreciated that the elevated concentration of nitrogen reduces reactivity of the bottom electrode 108 with oxygen. In some aspects, the bottom electrode 108 has a lesser reactivity with oxygen than the top electrode 112. This may further minimize formation of oxygen vacancies or traps in the ferroelectric structure 110 while depositing ferroelectric material of the ferroelectric structure 110. When the MFM device 130 is manufactured in bulk, fewer oxygen vacancies or traps lead to increased uniformity across instances of the MFM device 130 and hence increased manufacturing yields. Further, fewer oxygen vacancies or traps results in a larger remanent polarization and hence a larger memory window when the MFM device 130 is used for memory. The larger memory window leads to more reliable read operations. Further, the larger memory window enables wakeup-free operation of the MFM device 130.

Figure 2A:
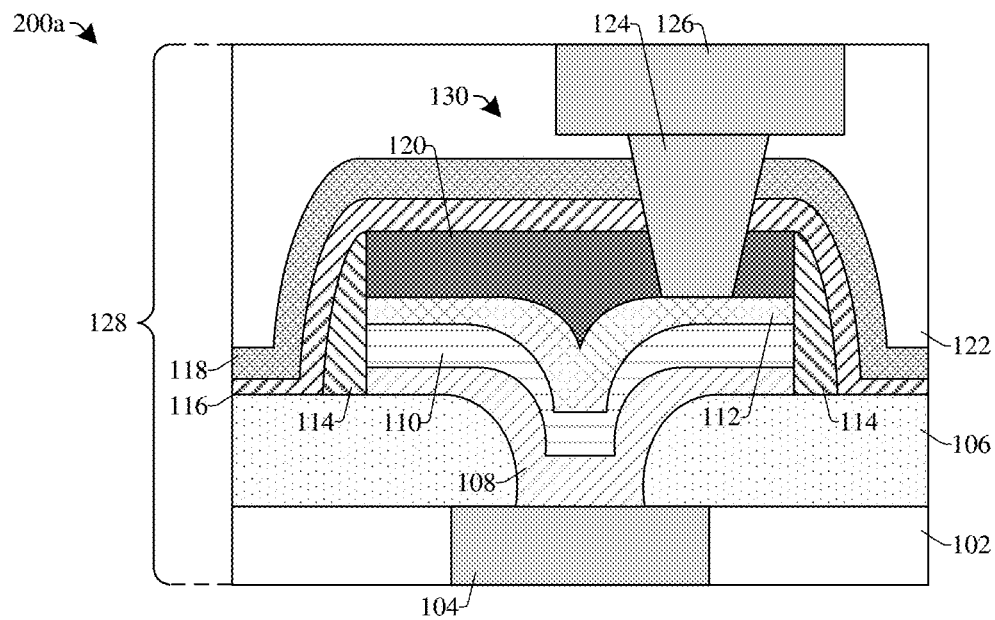
FIG. 2A illustrates a cross-sectional view of some embodiments of a semiconductor structure in which a MFM device with an enhanced bottom electrode is embedded in an interconnect structure.

FIG. 2A illustrates a cross-sectional view of some embodiments of a semiconductor structure 200a in which a MFM device 130 with an enhanced bottom electrode 108 is embedded in an interconnect structure 128.

The semiconductor structure 200a comprises a lower metal feature 104 arranged within a lower dielectric structure 102. The lower metal feature 104 may, for example, be a wire, a pad, or the like. In some embodiments, the lower dielectric structure 102 may comprise one or more of silicon dioxide (e.g., $SiO_2$), doped silicon dioxide (e.g., carbon doped silicon dioxide), silicon oxynitride (e.g., $N_2OSi_2$), borosilicate glass (BSG), phosphoric silicate glass (PSG), borophosphosilicate glass (BPSG), fluorinated silicate glass (FSG), or the like. A middle dielectric structure 106 is disposed over the lower dielectric structure 102. In various embodiments, the middle dielectric structure 106 may comprise one or more of silicon oxynitride (e.g., $N_2OSi_2$), silicon dioxide (e.g., $SiO_2$), silicon carbide (e.g., SiC), silicon nitride ($Si_3N_4$), Tetraethyl orthosilicate (TEOS) oxide, a low-K dielectric, or the like.

A MFM device 130 overlies the middle dielectric structure 106 and extends through the middle dielectric structure 106 to the lower metal feature 104. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

The bottom electrode 108 forms a bottom electrode via (BEVA) extending through the middle dielectric structure 106 to the lower metal feature 104. Further, the bottom electrode 108 has a horizontal bottom surface coupled to the lower metal feature 104 and curved outer sidewalls that extend from the horizontal bottom surface of the bottom electrode 108 to a top surface of the middle dielectric structure 106. Further, a lower horizontally extending surface of the bottom electrode 108 that is below an upper surface of the middle dielectric structure 106 is aligned over the horizontal bottom surface of the bottom electrode 108. Interior sidewalls of the bottom electrode 108 extend from the lower horizontally extending surface to a top surface of the bottom electrode 108 that is above the top surface of the middle dielectric structure 106. The lower horizontally extending surface of the bottom electrode 108 defines a recess within an upper surface of the bottom electrode 108.

The ferroelectric structure 110 is disposed on the bottom electrode 108. A bottom surface of the ferroelectric structure 110 is recessed below a top surface of the bottom electrode 108 and is recessed below a portion of the curved outer sidewalls of the bottom electrode 108. Curved sidewalls of the ferroelectric structure 110 extend from the bottom surface of the ferroelectric structure 110 to a top surface of the bottom electrode 108.

The top electrode 112 is disposed on the ferroelectric structure 110. A horizontal bottom surface of the top electrode 112 is below the top surface of the bottom electrode 108. Curved outer sidewalls of the top electrode 112 extend from the horizontal bottom surface of the top electrode 112 to a top surface of the ferroelectric structure 110. Curved interior sidewalls of the top electrode 112 extend in opposing directions from a common point that is below a top surface of the top electrode 112 to a top surface of the top electrode 112. In some aspects, the common point is a midpoint of the top electrode 112. In some aspects the common point or midpoint of the top electrode 112 is below a bottom surface of the top electrode 112. In some aspects, the bottom electrode 108, the ferroelectric structure 110, and the top electrode 112 are substantially symmetric about a line bisecting the bottom electrode 108, the ferroelectric structure 110, and the top electrode 112. In some aspects, the line bisects through the common point of the top electrode 112. The bottom surface of the top electrode 112 is aligned over the recess in the upper surface of the bottom electrode 108 and the bottom surface of the top electrode 112 is narrower than the lower horizontally extending surface of the bottom electrode 108.

In some embodiments, the top surface of the bottom electrode 108 has a concentration of nitrogen that is higher than a concentration of nitrogen in the bottom surface of the top electrode 112. This may correspond to the embodiments of 108n and 112n in FIG. 1B.

A mask 120 is disposed over the top electrode 112 and extends laterally between outermost sidewalls of the top electrode 112. In some embodiments, outermost sidewalls respectively of the mask 120, the top electrode 112, the ferroelectric structure 110, and the bottom electrode 108 are substantially vertically aligned. A sidewall spacer 114 extends from a top surface of the middle dielectric structure 106 to a top surface of the mask 120, wherein the sidewall spacer 114 extends along outermost sidewalls of the bottom electrode 108, the ferroelectric structure 110, the top electrode 112, and the mask 120. As such, the sidewall spacer 114 extends along a common sidewall formed by the bottom electrode, the top electrode, and the ferroelectric structure.

An etch stop layer 116 covers the mask 120 and extends from above the mask 120 to past outermost edges of the bottom electrode 108 to contact the middle dielectric structure 106. The sidewall spacer 114 separates outermost sidewalls respectively of the bottom electrode 108, the ferroelectric structure 110, the top electrode 112, and the mask 120 from the etch stop layer 116. A protective layer 118 contacts an upper surface of the etch stop layer 116 extending from above the mask 120 to past a top surface of the bottom electrode 108. An upper dielectric structure 122 extends from a top surface of the protective layer 118.

In some embodiments, the sidewall spacer 114 may comprise the same material as the mask 120. For example, in some embodiments the sidewall spacer 114 and the mask 120 may comprise a carbide (e.g., silicon carbide), a nitride (e.g., silicon nitride), an oxide (e.g., silicon oxy-nitride), or the like. In other embodiments, the sidewall spacer 114 may comprise a different material than the mask 120. In some embodiments, the protective layer 118 may comprise a carbide, an oxide, a nitride, TEOS oxide, or the like. In some embodiments, the etch stop layer 116 may comprise silicon carbide (e.g., SiC), silicon nitride ($Si_3N_4$), titanium nitride (e.g., TiN), or the like.

An upper metal feature 126 and a conductive via 124 overlie the MFM device 130. The upper metal feature 126 may, for example, be a wire, a pad, or the like. The conductive via 124 extends from the upper metal feature 126, through the upper dielectric structure 122, the protective layer 118, the etch stop layer 116, and the mask 120, to the top electrode 112. As such, the protective layer 118, the etch stop layer 116, and the mask 120 extend laterally from sidewalls of the conductive via 124. Additionally, the upper metal feature 126 and the conductive via 124 are offset from the midpoint of the top electrode 112. In some embodiments, the upper metal feature 126 and the lower metal feature 104 are wires, pads, or the like. In some embodiments, the upper metal feature 126, the lower metal feature 104, and the conductive via 124 are or comprise copper, tungsten, aluminum, some other suitable material(s), or any combination of the foregoing.

By forming at least the bottom electrode with a material like molybdenum, the remanent polarization of the MFM device 130 may be improved. As such, the memory window may be larger when the MFM device 130 is used as memory. Further, the MFM device 130 may operate free of a wakeup procedure.

Figure 2B:
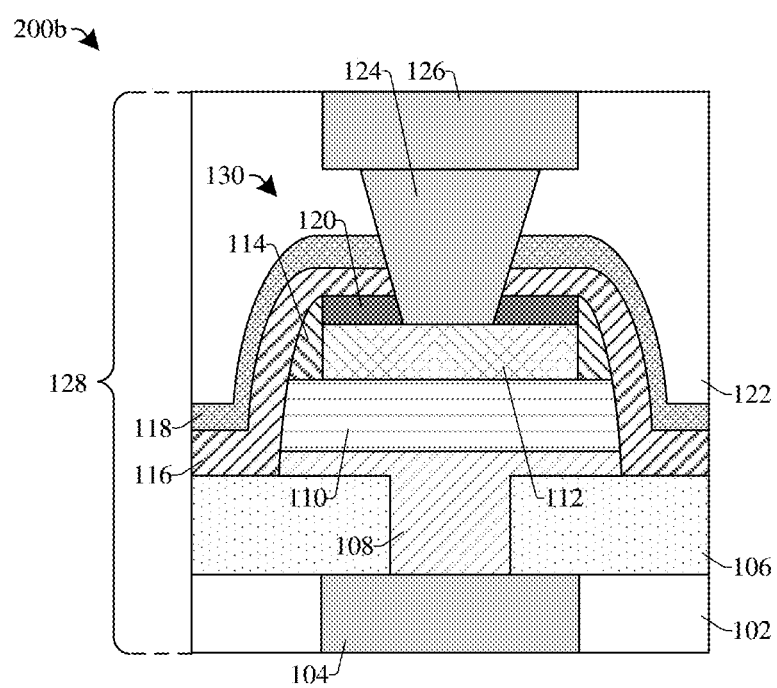
FIGS. 2B-2D illustrate cross-sectional views of some alternative embodiments the semiconductor structure of FIG. 2A.

FIG. 2B illustrates a cross-sectional view of some alternative embodiments the semiconductor structure of FIG. 2A in which the bottom electrode 108 has a T-shaped profile and the sidewall spacer 114 overlies the ferroelectric structure 110.

In accordance with the semiconductor structure 200b of FIG. 2B, the middle dielectric structure 106 comprises substantially vertical sidewalls where the bottom electrode 108 extends through the middle dielectric structure 106. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

The bottom electrode 108 has a horizontal bottom surface coupled to the lower metal feature 104 and substantially vertical outer sidewalls that extend from the horizontal bottom surface of the bottom electrode 108 to the top surface of the middle dielectric structure 106. The bottom electrode 108 extends above the middle dielectric structure 106 and extends horizontally over the middle dielectric structure 106, wherein a top surface of the bottom electrode 108 is wider than the horizontal bottom surface of the bottom electrode 108. As such, the bottom electrode 108 forms a T-shape profile and forms a bottom electrode via protruding to a first metal layer of the pair of neighboring metal layers of the alternating stack.

The ferroelectric structure 110 is disposed on the bottom electrode 108. A width of a top surface of the ferroelectric structure 110 is less than a width of the top surface of the bottom electrode 108. The top electrode 112 is disposed on the ferroelectric structure 110, wherein outermost sidewalls of the top electrode 112 are narrower than outermost sidewalls of the ferroelectric structure 110. The mask 120 is disposed over the top electrode 112, wherein outermost sidewalls of the mask 120 are substantially aligned with outermost sidewalls of the top electrode 112.

The bottom electrode 108 comprises a material with characteristics that enable wakeup-free operations of the MFM device 130. For example, the bottom electrode 108 may comprise molybdenum. In some embodiments, the top electrode 112 may comprise molybdenum. In some embodiments, the bottom electrode 108 and/or the top electrode 112 may, for example, consist of or consist essentially of molybdenum. As recited above, by forming at least the bottom electrode 108 from molybdenum or a material like molybdenum, the MFM device 130 can operate free of a wakeup procedure.

The sidewall spacer 114 extends from the top surface of the ferroelectric structure 110 along outermost sidewalls of the top electrode 112 and the mask 120 to a top surface of the mask 120. An etch stop layer 116 covers the mask 120 and extends from above the mask 120 to past outermost edges of the bottom electrode 108 to contact the middle dielectric structure 106. The etch stop layer 116 extends along sidewalls of the sidewall spacer 114, the ferroelectric structure 110, and the bottom electrode 108. The sidewall spacer 114 separates outermost sidewalls respectively of the mask 120 and the top electrode 112 from the etch stop layer 116. Inner and outer sidewalls of the etch stop layer 116 are curved and outermost sidewalls respectively of the ferroelectric structure 110 and the bottom electrode 108 that contact the etch stop layer 116 are curved.

The protective layer 118 is disposed on an upper surface of the etch stop layer 116 extending from above the mask 120 to past a top surface of the bottom electrode 108. An upper dielectric structure 122 extends from a top surface of the protective layer 118. The upper metal feature 126 and the conductive via 124 overlie the MFM device 130. Further, the conductive via 124 extends through the upper dielectric structure 122, the protective layer 118, the etch stop layer 116, and the mask 120, from the upper metal feature 126 to contact the top electrode 112. The upper metal feature 126 and the conductive via 124 are substantially aligned with a center of the bottom electrode 108, the ferroelectric structure 110, and the top electrode 112.

Figure 2C:
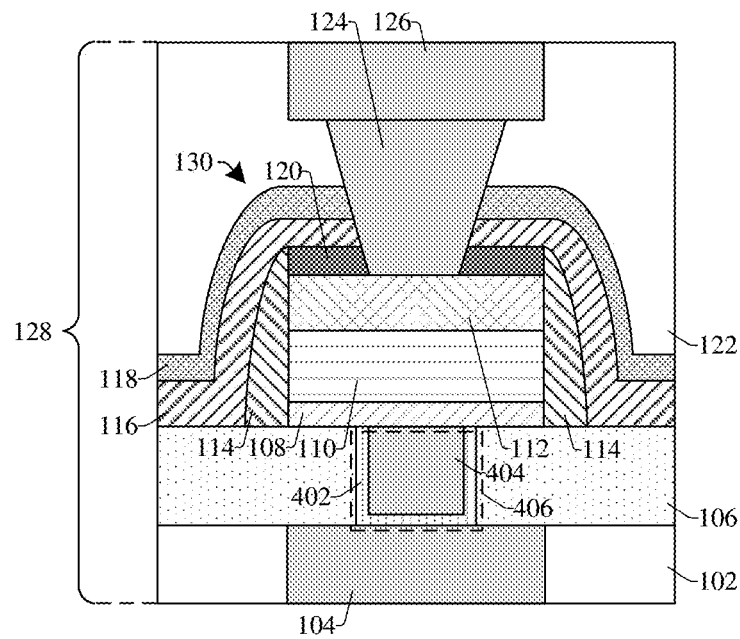

FIG. 2C illustrates a cross-sectional view of some alternative embodiments the semiconductor structure of FIG. 2A in which the BEVA 406 is independent of the bottom electrode 108 and comprises a conductive plug 404 lined by a conductive liner 402.

In accordance with the semiconductor structure 200c of FIG. 2C, the BEVA 406 comprises a conductive plug 404 overlying a conductive liner 402. The conductive liner 402 is disposed along the top surface of the lower metal feature 104 and continues along the substantially vertical sidewalls of the middle dielectric structure 106 defining an opening. The conductive liner 402 has a "U" shaped profiled defined by an upper surface of the conductive liner 402 and interior sidewalls that form an opening within the conductive liner 402. In various embodiments the conductive liner 402 may prevent diffusion between adjacent structures, and the conductive liner 402 may be or comprise titanium nitride (e.g., TiN), tantalum nitride (e.g., $Ta_xN_y$), or the like.

The conductive plug 404 is disposed within the conductive liner 402 and extends to a top surface of the middle dielectric structure 106. The bottom electrode 108 is disposed along a top surface of the middle dielectric structure 106, the conductive liner 402, and conductive plug 404. In some embodiments, the conductive liner 402 may comprise the same material as the bottom electrode 108, such as molybdenum or the like. In further embodiments, the conductive liner 402 may, for example, consist of or consist essentially of molybdenum. In other aspects, the conductive liner 402 and the bottom electrode 108 comprise different materials, wherein the conductive liner 402 may comprise titanium nitride (e.g., TiN), platinum, aluminum copper, gold, titanium, tantalum, tantalum nitride (e.g., $Ta_xN_y$), tungsten, tungsten nitride (e.g., $W_3N_2$), or combinations thereof. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

Figure 2D:
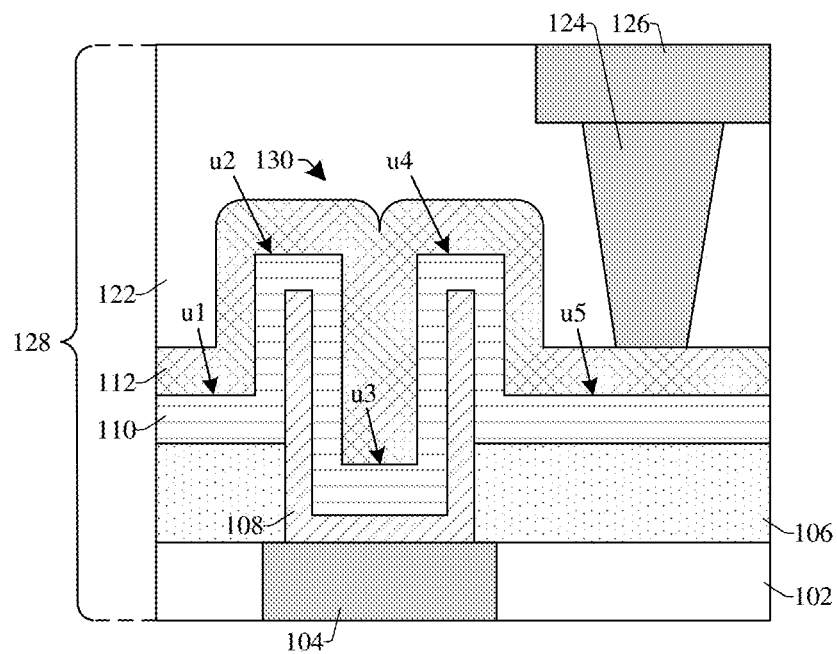

FIG. 2D illustrates a cross-sectional view of some alternative embodiments of the semiconductor structure of FIG. 2A in which the bottom electrode 108 has a U-shaped profile.

In accordance with the semiconductor structure 200d of FIG. 2D, the middle dielectric structure 106 comprises substantially vertical sidewalls over the lower metal feature 104. The MFM device 130 is disposed between the substantially vertical sidewalls and over the middle dielectric structure 106. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

The MFM device 130 comprises the ferroelectric structure 110 separating the bottom electrode 108 from the top electrode 112. The bottom electrode 108 has a horizontal bottom portion adjoined to vertical portions at opposite ends of the horizontal bottom portion, thereby forming a "U" shape. As such, the horizontal bottom portion of the bottom electrode 108 is disposed along a top surface of the lower metal feature 104 and the vertical portions of the bottom electrode 108 extends along the substantially vertical sidewalls of the opening in the middle dielectric structure 106. The vertical portions of the bottom electrode 108 are aligned between outermost sidewalls of the lower metal feature 104 and extend above the top surface of the middle dielectric structure 106.

The ferroelectric structure 110 is disposed on the top surface of the middle dielectric structure 106 and the top surface of the bottom electrode 108. The ferroelectric structure 110 comprises a plurality of elevations according to the surfaces of the middle dielectric structure 106 and the bottom electrode 108 that the ferroelectric structure 110 covers. The ferroelectric structure 110 comprises a lower most section that extends from the horizontal bottom portion of the bottom electrode 108 to upper surface u3 of the ferroelectric structure 110. Upper surface u3 is below the top surface of the middle dielectric structure 106, and the lowermost section of the ferroelectric structure 110 is disposed between inner sidewalls of the bottom electrode 108. The ferroelectric structure 110 extends from the lowermost section, along interior sidewalls of the bottom electrode 108, to upper surfaces u2 and u4 of the ferroelectric structure 110 above an upper surface of the bottom electrode 108. Upper surfaces u2 and u4 are substantially level with one another in the horizontal direction. The ferroelectric structure 110 comprises interior sidewalls separated by upper surface u3 of the ferroelectric structure 110.

The ferroelectric structure 110 continuously extends from upper surfaces u2 and u4, along outer sidewalls of the bottom electrode 108, to contact a top surface of the middle dielectric structure 106 below the top surface of the bottom electrode 108. As such, the ferroelectric structure 110 comprises upper surfaces u1 and u5 that are aligned above the top surface of the middle dielectric structure 106, wherein upper surfaces u1, u5 are below upper surfaces u2, u4 and above upper surface u3. Upper surfaces u1, u5 are laterally offset from the bottom electrode 108. The ferroelectric structure 110 continuously extends along the upper surface of middle dielectric structure 106 at an elevation below upper surfaces u1, u5. Upper surfaces u1 and u5 are substantially level with one another.

The top electrode 112 is disposed on the ferroelectric structure 110. The top electrode 112 is disposed on upper surface u3 of the ferroelectric structure 110 and continuously extends along and between inner sidewalls of the of the ferroelectric structure 110 to above upper surfaces u2, u4 of the ferroelectric structure 110. The top electrode 112 has a midpoint directly above a center of the top surface u3, and the top electrode 112 extends vertically from the midpoint with curved sidewalls to an uppermost surface of the top electrode 112 above upper surfaces u2, u4 of the ferroelectric structure 110. The top electrode 112 extends continuously along upper surfaces u2, u4 and along outer sidewalls of the ferroelectric structure 110 to upper surfaces u1, u5 of the ferroelectric structure 110. As such, the top electrode 112 comprises first upper surfaces above upper surfaces u1, u5 of the ferroelectric structure 110 and second upper surfaces above u2, u4 of the ferroelectric structure 110. Furthermore, the top electrode 112 comprises outer sidewalls that extend vertically between upper surfaces u2, u4 and upper surfaces u1, u5 of the ferroelectric structure 110. In some aspects, the ferroelectric structure 110 and the top electrode 112 wrap around a top edge of the bottom electrode 108.

The bottom electrode 108 comprises a material with characteristics that result in wakeup-free operations of the MFM device 130. For example, the bottom electrode 108 may comprise molybdenum. In some aspects, the top electrode 112 may comprise molybdenum. In further embodiments, the bottom electrode 108 and/or the top electrode 112 consist of or consist essentially of molybdenum. As recited above, by forming at least the bottom electrode 108 from a material like molybdenum, the MFM device 130 can operate free of a wakeup procedure.

The upper dielectric structure 122 extends vertically from a top continuous surface of the top electrode 112. Thus, the upper dielectric structure 122 extends from above the first and second upper surfaces of the top electrode 112 and past outer sidewalls of the top electrode 112. The conductive via 124 extends through the upper dielectric structure 122 to contact the first upper surface of the top electrode 112 aligned above upper surface u5 of the ferroelectric structure 110. Further, the conductive via 124 extends from above the top electrode 112 and past the outer sidewalls of the top electrode 112 to contact the first upper surface of the top electrode 112.

Figure 3:
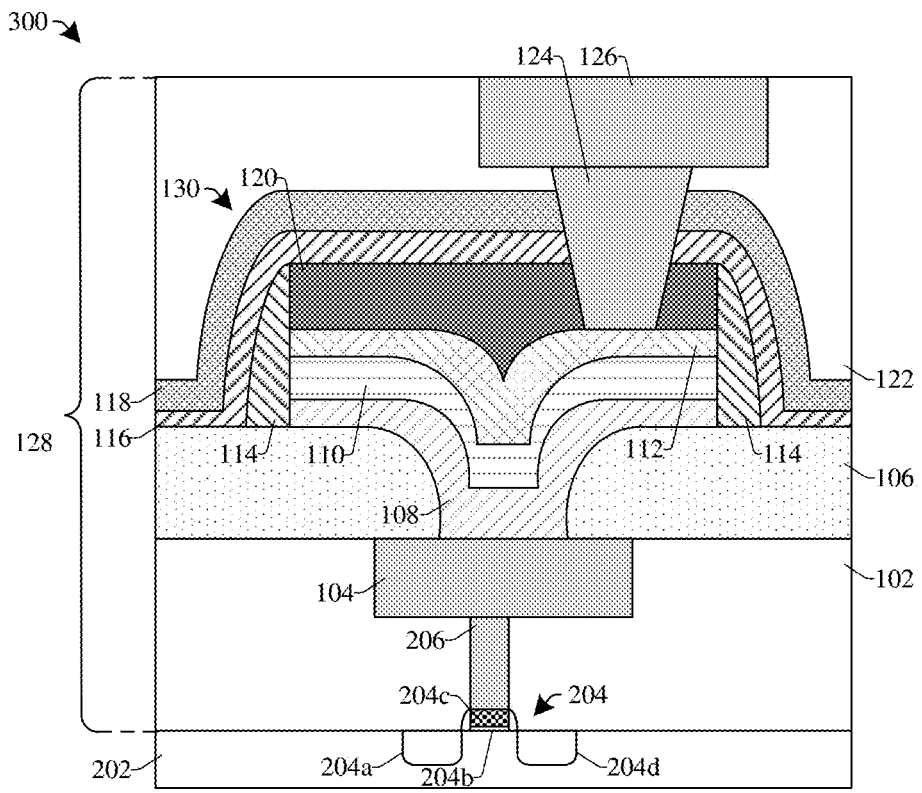
FIG. 3 illustrates an expanded cross-sectional view of some embodiments of the semiconductor structure of FIG. 2A in which the MFM device is electrically coupled to a gate electrode of a field-effect transistor (FET) to form an MFM FET.

FIG. 3 illustrates an expanded cross-sectional view of some embodiments of the semiconductor structure 300 of FIG. 2A in which the MFM device 130 is electrically coupled to a gate electrode 204c of an access device 204, such as a field-effect transistor (FET) or the like, to form an MFM FET.

The semiconductor structure 300 shows the substrate 202 disposed under the lower dielectric structure 102 with an access device 204 arranged within the substrate 202. In some embodiments the substrate 202 is referred to as a semiconductor substrate. In some embodiments, the access device 204 may comprise a transistor device (e.g., a metal-oxide-semiconductor field-effect transistor (MOSFET), a bi-polar junction transistor (BJT), a high electron mobility transistor (HEMT), or the like). In some embodiments, the substrate 202 may comprise a semiconductor material (e.g., silicon, germanium, or the like).

In some embodiments, the access device 204 comprises a source region 204a a drain region 204d between which a gate electrode 204c is arranged. The access device 204 further comprises a gate dielectric 204b arranged below the gate electrode 204c and a gate spacer 204e arranged along sidewalls of the gate dielectric 204b and gate electrode 204c. In some embodiments, the access device 204 is partially formed by the substrate 202.

A conductive contact 206 extends from the gate electrode 204c of the access device 204 to the lower metal feature 104 surrounded by the lower dielectric structure 102. The conductive contact 206 further defines the interconnect structure 128 to facilitate electrical coupling between the access device 204 and the MFM device 130. The interconnect structure 128 includes an alternating stack of metal layers and via layers. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

In other embodiments, the interconnect structure 128 comprises additional levels of interconnect features, such as vias, conductive wires, and the like, between the conductive contact 206 and the lower metal feature 104. In some embodiments the conductive contact 206 may comprise a conductive material, such as copper, tungsten, and/or aluminum. In some embodiments, the bottom electrode 108 is electrically shorted to the gate electrode 204c of the access device 204 by the interconnect structure 128.

Figure 4:
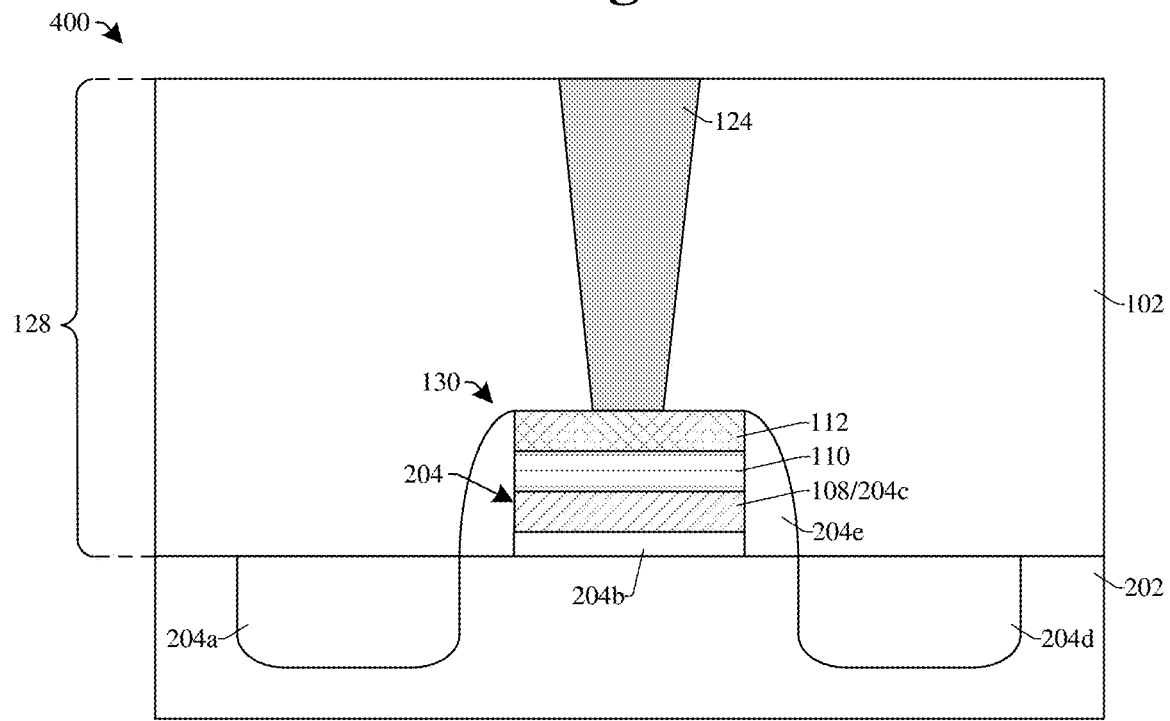
FIG. 4 illustrates a cross-sectional view of some alternative embodiments of the semiconductor structure of FIG. 3 in which the enhanced bottom electrode and the gate electrode are integrated together.

FIG. 4 illustrates a cross-sectional view of some alternative embodiments of the semiconductor structure of FIG. 3 in which the MFM device 130 is integrated with the gate electrode 204c.

In accordance with the semiconductor structure 400 of FIG. 4, the MFM device 130 is arranged on the gate electrode 204c, and the bottom electrode 108 of the MFM device 130 and the gate electrode 204c of the access device 204 are one and the same. As such, the MFM device 130 is integrated with the access device 204. Further, a lower dielectric structure 102 surrounds the access device 204 and the MFM device 130, and a contact vias 124 extends through the lower dielectric structure 102 from the MFM device 130.

Other than the being integrated with the MFM device 130, the access device 204 is as described with regard to FIG. 3. Further, other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

Figure 5:
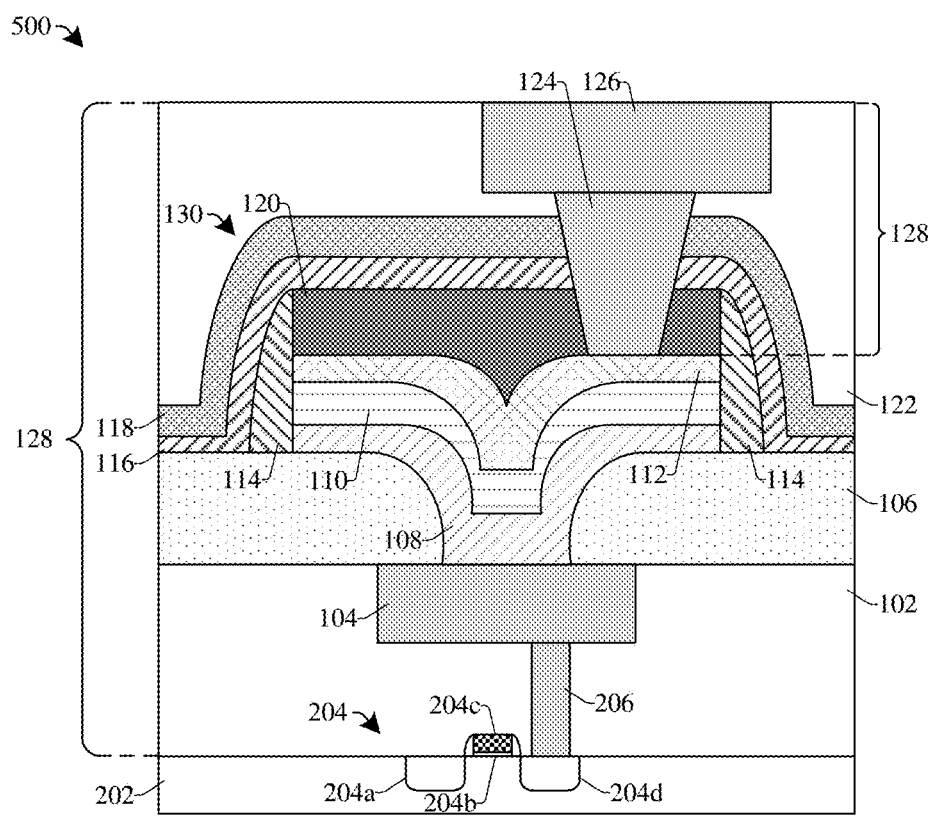
FIG. 5 illustrates a cross-sectional view of some alternative embodiments of the semiconductor structure of FIG. 3 in which the MFM device is electrically coupled to a source or drain region of FET to instead form a one-transistor, one-capacitor (1T1C) memory device.

FIG. 5 illustrates a cross-sectional view 500 of some alternative embodiments of the semiconductor structure of FIG. 3 in which the MFM device 130 is electrically coupled to a source or drain region of an access device 204, such as a FET, to instead form a one-transistor, one-capacitor (1T1C) memory device.

Cross-sectional view 500 shows the conductive contact 206 coupled to the drain region 204d of access device 204. Other than arrangement relative to MFM device 130, the access device 204 is as described with regard to FIG. 3. Other than layout, the bottom electrode 108, the ferroelectric structure 110, and the top electrode 112 of the MFM device 130 are as described with regard to FIG. 1A. In alternative embodiments, the MFM device 130 further comprises the nitrogen-rich layer 108n described with regard to FIG. 1B.

The conductive contact 206 extends from drain region 204d to the lower metal feature 104 surrounded by the lower dielectric structure 102. In other embodiments (not pictured), the source region 204a is coupled to the MFM device 130 through conductive contact 206. As such, the access device 204 coupled to the MFM device 130 by the drain region 204d forms the 1T1C memory device. In some embodiments, the bottom electrode 108 is electrically shorted to the drain region 204d of the access device 204 by the interconnect structure 128.

Figure 6:
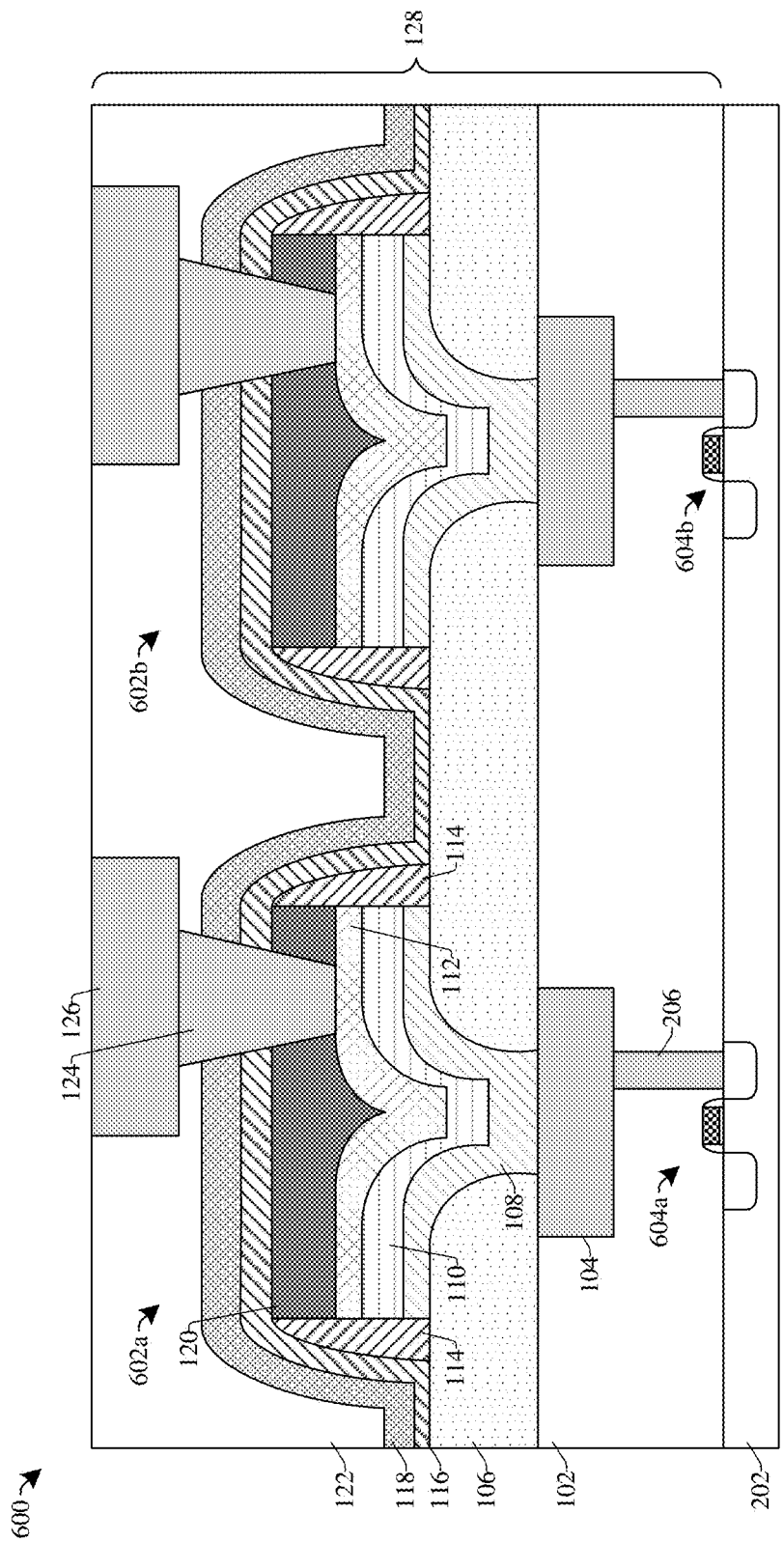
FIG. 6 illustrates a cross-sectional view of some embodiments of a semiconductor structure comprising a plurality of 1T1C memory device each as in FIG. 5.

FIG. 6 illustrates a cross-sectional view of some embodiments of a semiconductor structure including a first MFM device 602a and second MFM device 602b comprising a plurality of 1T1C cells as in FIG. 5.

Semiconductor structure 600 comprises a first access device 604a and a second access device 604b disposed within a substrate 202 that are analogous to access device 204 of FIG. 5. The first MFM device 602a is coupled to the first access device 604a, and the second MFM device 602b is coupled to the second access device 604b. The first MFM device 602a and the second MFM device 602b are each as their counter is described with regard to FIG. 5. Further, the first MFM device 602a and the second MFM device 602b have individual bottom electrodes 108, individual ferroelectric structures 110 respectively overlying the bottom electrodes 108, and individual top electrodes 112 respectively overlying the ferroelectric structures 110. Other than layout, the bottom electrodes 108, the ferroelectric structures 110, and the top electrodes 112 are as their counterparts are described with regard to FIG. 1A or 1B.

Upper metal features 126 and conductive vias 124 respectively overlie the first and second MFM devices 602a, 602b. The conductive vias 124 extends respectively from the upper metal features 126 respectively to the first and second MFM devices 602a, 602b.

The first access device 604a and the second access device 604b can be configured to apply bias conditions to the first MFM device 602a and the second MFM device 602b accordingly to configure a first data state (e.g., a '0') or a second data state (e.g., a '1') depending upon bias condition.

By forming at least the bottom electrode 108 from a material like molybdenum, the first MFM device 602a and the second MFM device 602b operate with fewer oxygen vacancies in the ferroelectric structures 110, thereby leading to more reliable operation.

FIGS. 7-19 illustrate a series of cross-sectional views 700-1900 of some embodiments of a method for forming a semiconductor structure that includes a MFM device with an enhanced bottom electrode. Although FIGS. 7-19 are described in relation to a method, it will be appreciated that the structures disclosed in FIGS. 7-19 are not limited to such a method, but instead may stand alone as structures independent of the method.

Figure 7:
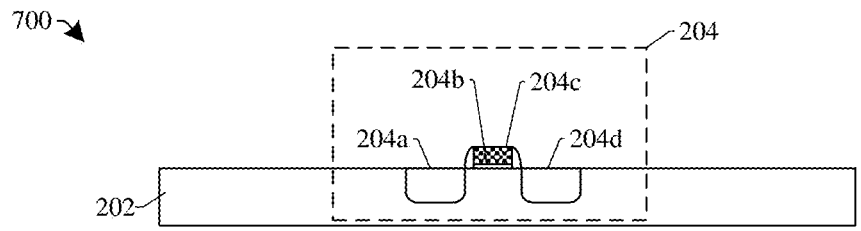
FIGS. 7-19 illustrate a series of cross-sectional views of some embodiments of a method for forming a semiconductor structure in which a memory cell includes a MFM device with an enhanced bottom electrode.

As shown in cross-sectional view 700 of FIG. 7, a substrate 202 is provided. An access device 204 is formed within the substrate 202. In various embodiments, the substrate 202 may be any type of semiconductor body (e.g., silicon, SiGe, silicon on insulator (SOI), etc.), such as a semiconductor wafer and/or one or more die on a wafer, as well as any other type of semiconductor and/or epitaxial layers, associated therewith. In some embodiments, the access device 204 may be or comprise a transistor. In some such embodiments, the access device 204 may be formed by depositing a gate dielectric film and a gate electrode film over the substrate 202. The gate dielectric film and the gate electrode film are subsequently patterned to form a gate dielectric (e.g., 204b) and a gate electrode (e.g., 204c). The substrate 202 may be subsequently implanted to form a source region (e.g., 204a) and a drain region (e.g., 204d) within the substrate 202 on opposing sides of the gate electrode (e.g., 204c).

Figure 8:
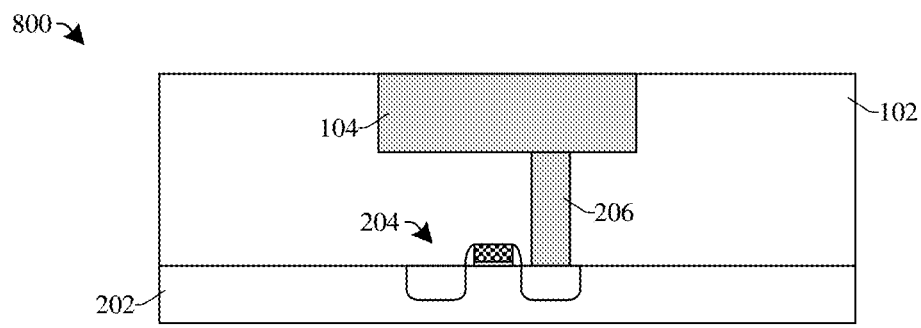

As shown in cross-sectional view 800 of FIG. 8, a conductive contact 206 and a lower metal feature 104 are formed within a lower dielectric structure 102 over the substrate 202. The conductive contact 206 is formed in contact with one of the source region (e.g., 204a) or the drain region (e.g., 204d).

In some additional embodiments, to form the conductive contact 206 and the lower metal feature 104 within the lower dielectric structure 102, a first portion (e.g., an oxide, a low-k dielectric, an ultra low-k dielectric, or the like) of the lower dielectric structure 102 is deposited and selectively etched to define a hole or trench. A conductive material (e.g., copper, aluminum, etc.) is deposited within the hole or trench to form the conductive contact 206, and a planarization process (e.g., a chemical mechanical planarization process) is performed. After the planarization, the foregoing processing steps are repeated to form the lower metal feature 104.

Figure 9:
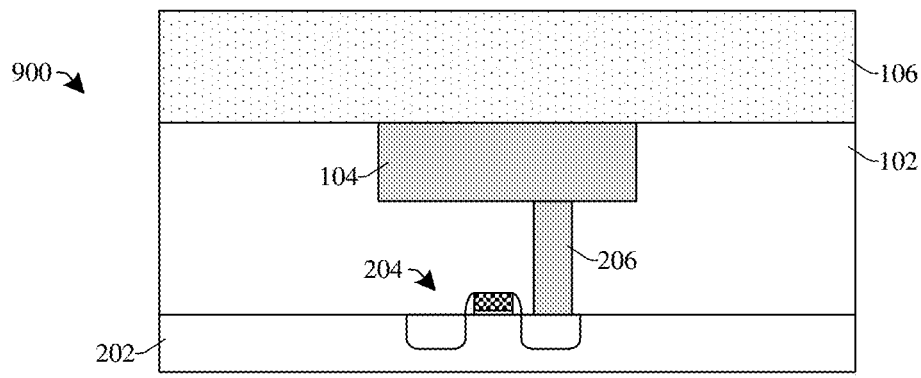

As shown in cross-sectional view 900 of FIG. 9, a middle dielectric structure 106 is formed over the lower dielectric structure 102 and the lower metal feature 104. In some embodiments, the middle dielectric structure 106 is referred to as a middle dielectric layer or a dielectric layer. In some embodiments, the middle dielectric structure 106 may comprise one or more of silicon oxynitride (e.g., $N_2OSi_2$), silicon dioxide (e.g., $SiO_2$), silicon carbide (e.g., SiC), silicon nitride ($Si_3N_4$), Tetraethyl orthosilicate (TEOS) oxide, a low-K dielectric, or the like. In some embodiments, the middle dielectric structure 106 may be formed by one or more different deposition processes (e.g., physical vapor deposition (PVD), chemical vapor deposition (CVD), plasma enhanced CVD (PE-CVD), atomic layer deposition (ALD), sputtering, or the like).

Figure 10:
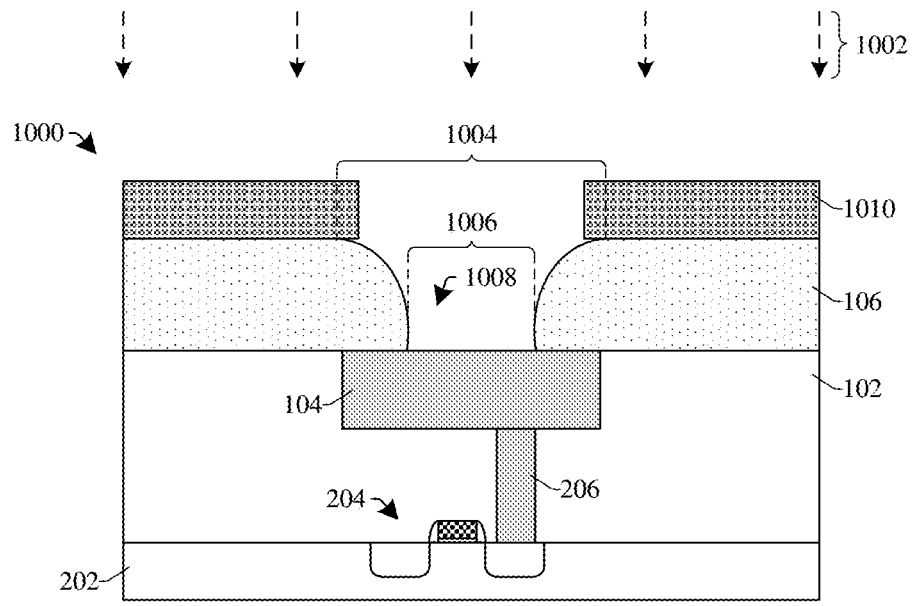

As shown in cross-sectional view 1000 of FIG. 10, the middle dielectric structure 106 is selectively patterned to define an opening 1008 extending through the middle dielectric structure 106. The opening 1008 expose a top surface of the lower metal feature 104. In some embodiments, the middle dielectric structure 106 may be selectively patterned by exposing the middle dielectric structure 106 to an etchant 1002 according to a patterned masking layer 1010 disposed on the middle dielectric structure 106. In some embodiments, the patterned masking layer 1010 may comprise a photoresist material, a hard mask, or the like. In some embodiments, the etchant 1002 may comprise a dry etchant (e.g., comprising fluorine or chlorine). The selective patterning process forms the opening 1008 with a lower width 1006 and an upper width 1004 that is greater than the lower width 1006. Thus the opening 1008 is formed with curved sidewalls that gradually extend from the lower width 1006 at a top surface of the lower metal feature 104 to the upper width 1004 at a top surface of the middle dielectric structure 106.

Figure 11:
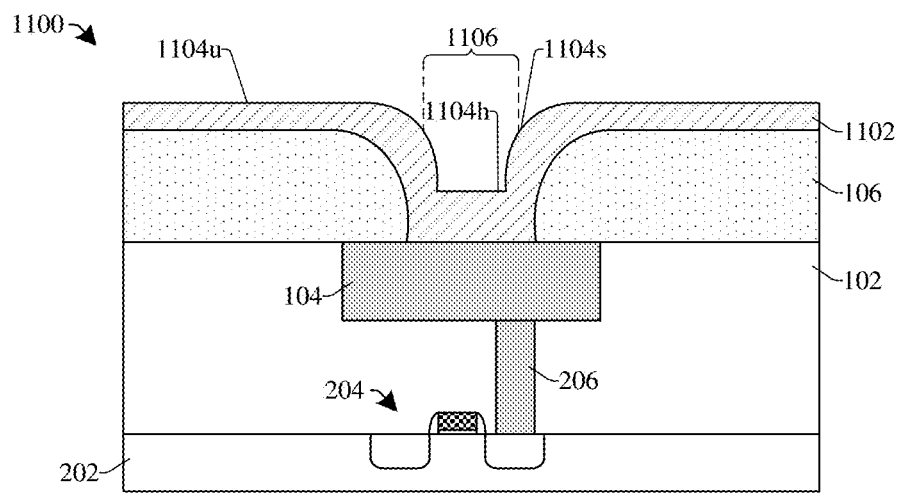

As shown in cross-sectional view 1100 of FIG. 11, a bottom electrode layer 1102 is formed over the middle dielectric structure 106 and within opening 1008 (See FIG. 10). The bottom electrode layer 1102 extends through the middle dielectric structure 106 and contacts a top surface of the lower metal feature 104. The bottom electrode layer 1102 is formed with curved sidewalls 110s separated by a horizontally extending surface 1104h that define a recess 1106 within an upper surface 1104u of the bottom electrode layer 1102. The recess 1106 is aligned directly above a bottommost surface of the bottom electrode layer 1102 that contacts the lower metal feature 104. The bottom electrode layer 1102 is formed along the curved sidewalls of opening 1008 (see FIG. 10). Thus exterior sidewalls of the bottom electrode layer 1102 are curved and extend with a lower width 1006 (see FIG. 10) at the top surface of the lower metal feature 104 to the upper width 1004 (see FIG. 10) at the top surface of the middle dielectric structure 106.

In some embodiments, the bottom electrode layer 1102 may be formed by depositing a liner (not shown) followed by depositing a conductive material. In various embodiments, the liner may comprise a glue layer configured to increase adhesion between adjacent layers and/or a diffusion barrier layer configured to prevent diffusion between adjacent layers. In some embodiments, the bottom electrode layer 1102 may, for example, be deposited by a PVD, CVD, ALD, plasma-enhanced CVD (PECVD), plasma-enhanced ALD (PEALD) process, sputtering, or other suitable process to a thickness of 1 to 500 angstroms or a thickness of 50 to 200 angstroms.

In some embodiments, the bottom electrode layer 1102 comprises a material with characteristics that minimizes the formation of oxygen vacancies or traps in a MFM device. In other embodiments, the bottom electrode layer 1102 comprises a material that reacts with oxygen less than comparable materials (e.g., when compared to one or more of titanium (Ti), tantalum (Ta), tungsten (W), tantalum nitride (e.g., $Ta_xN_y$), titanium nitride (e.g., TiN), or the like). In some embodiments the bottom electrode layer 1102 comprises or consists essentially of a material with properties including one or more of a thermal expansion of $5.1E^{-6}$ m/m/° C., a density of 10.2 g/cm$^3$, or electrical conductivity of $17.9E^6$ S/m at 20° C. In some embodiments the bottom electrode layer 1102 comprises or consists essentially of a material with an oxidation state between −1 and +1. In some embodiments the bottom electrode layer 1102 comprises or consists essentially of a material with an oxidation state less than one or more of titanium (Ti), tantalum (Ta), tungsten (W), tantalum nitride (e.g., $Ta_xN_y$), titanium nitride (e.g., TiN), or the like. In other embodiments, the bottom electrode layer 1102 comprises molybdenum. In some embodiments, the bottom electrode layer 1102 consists of or consists essentially of molybdenum. In some embodiments, the bottom electrode layer 1102 is predominantly molybdenum (e.g., the bottom electrode 108 is 80% or more molybdenum by mass, atomic percentage, or the like). In some embodiments, the bottom electrode layer 1102 comprises or consists essentially of one or more of a molybdenum compound, molybdenum sulfide (e.g., $MoS_2$), molybdenum bromide (e.g., $MoBr_3$), molybdenum chloride ($MoCl_2$), molybdenum hexacarbonyl ($Mo(CO)_6$), or the like. The preceding material characterizations, materials, and compositions for the bottom electrode layer 1102 can enable wakeup-free operation of the MFM device. Furthermore, the preceding material characterizations, materials, and compositions for the bottom electrode layer 1102 can minimize the formation of oxygen vacancies or traps from forming in a ferroelectric layer during deposition of the ferroelectric layer on the bottom electrode layer 1102.

In some embodiments, the bottom electrode layer 1102 can be formed with a material comprising a crystal structure and directional lattice constant matched to a subsequent ferroelectric layer (e.g. ferroelectric structure 110 of FIGS. 1A-1B). Such a material may, for example, be molybdenum or the like. In this example, a bottom electrode formed from the bottom electrode layer 1102 facilitates a large ferroelectric response with a ferroelectric layer (e.g. ferroelectric structure 110 of FIGS. 1A-1B) formed on the bottom electrode by increasing the orthorhombic phase (dipoles) within the ferroelectric layer.

Furthermore, the bottom electrode layer 1102 can be formed with the inclusion of an annealing process that, for example, can improve characteristics of molybdenum for the subsequent ferroelectric layer. For example, the tensile strength of molybdenum can be improved with an annealing process. Additionally, or alternatively, the bottom electrode layer 1102 can be formed with a nitrogen treatment process to further improve the inert properties of the bottom electrode layer 1102 and improving the performance of the subsequent ferroelectric layer.

Figure 12:
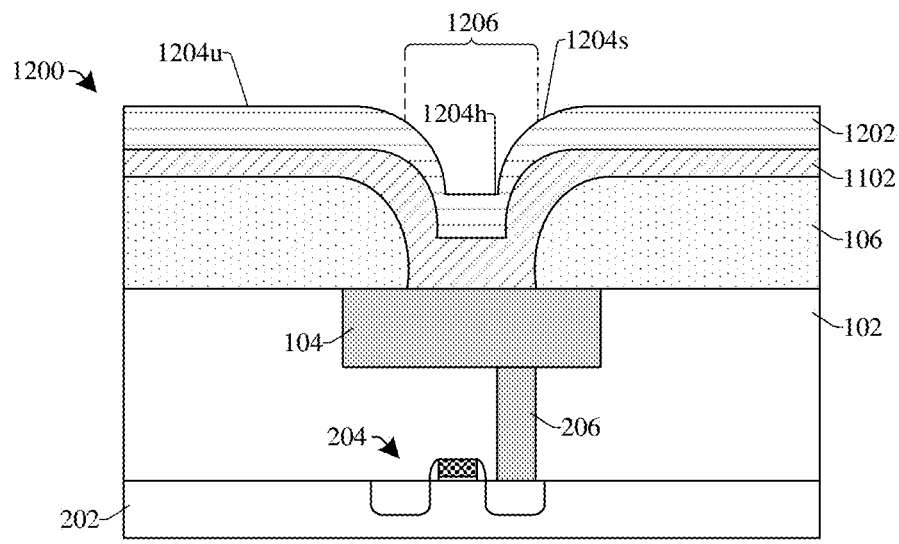

As shown in cross-sectional view 1200 of FIG. 12, a ferroelectric layer 1202 is formed over the bottom electrode layer 1102. In some embodiments, the ferroelectric layer 1202 may, for example, be deposited by PVD, CVD, ALD, PECVD, PEALD, sputtering, or other suitable process to a thickness of 1 to 500 angstroms. The ferroelectric layer 1202 is formed within recess 1106 of the bottom electrode layer 1102 (see FIG. 11). The ferroelectric layer 1202 has curved sidewalls 1204s separated by a horizontally extending surface 1204h that define a recess 1206 within an upper surface 1204u of the ferroelectric layer 1202. Horizontally extending surface 104h is aligned directly over horizontally extending surface 1104h of the bottom electrode layer 1102 (see FIG. 11). As such, the ferroelectric layer 1202 is formed with exterior curved sidewalls disposed along curved sidewalls 110s of the bottom electrode layer 1102 (see FIG. 11).

In some embodiments, the ferroelectric layer 1202 is or comprises lead zirconate titanate (e.g., PZT), strontium bismuth tantalate (e.g., SBT), the like, or any combination of the foregoing. In some embodiments, the ferroelectric layer 1202 is or comprises hafnium oxide (e.g., $HfO_2$) doped with silicone, zirconium, yttrium, aluminum, gadolinium, strontium, lanthanum, scandium, germanium, the like, or any combination of the foregoing. In some embodiments, the ferroelectric layer 1202 is or comprises hafnium oxide (e.g., $HfO_2$) and/or some other suitable binary oxide(s). In some embodiments, the ferroelectric layer 1202 is or comprises hafnium silicate (e.g., $HfSiO_x$), hafnium zirconate (e.g., $HfZrO_x$), barium titanate (e.g., $BaTiO_3$), lead titanate (e.g., $PbTiO_3$), strontium titanate (e.g., $SrTiO_3$), calcium manganite (e.g., $CaMnO_3$), bismuth ferrite (e.g., $BiFeO_3$), aluminum scandium nitride (e.g., AlScN), aluminum gallium nitride (e.g., AlGaN), aluminum yttrium nitride (e.g., AlYN), some other suitable ternary oxide(s), or any combination of the foregoing. In some embodiments, the ferroelectric layer 1202 is or comprises barium strontium titanate (e.g., BaSrTiOx) and/or some other suitable quaternary oxide(s).

Figure 13:
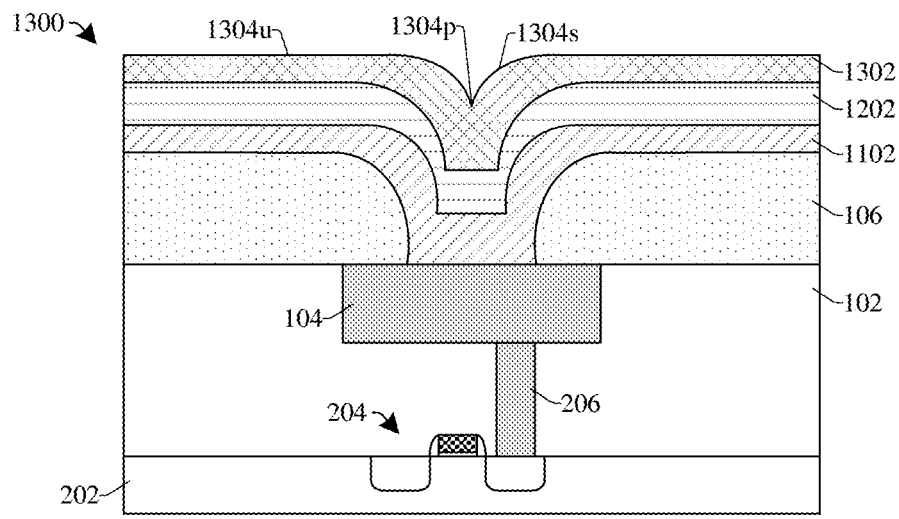

As shown in cross-sectional view 1300 of FIG. 13, a top electrode layer 1302 is formed over the ferroelectric layer 1202. The top electrode layer 1302 is formed within recess 1206 of the ferroelectric layer 1202 (see FIG. 12). The top electrode layer 1302 extends from recess 1206 of the ferroelectric layer 1202, along curved sidewalls 1204s of the ferroelectric layer 1202 to the horizontally extending surface 1204h of the ferroelectric layer 1202 (see FIG. 12). The top electrode layer 1302 is formed with curved interior sidewalls 1304s that extend from a common point 1304p that is aligned directly over recess 1206 of the ferroelectric layer 1202 (see FIG. 12), where the common point 1304p is below an upper surface 1304u of the top electrode layer 1302.

In some embodiments, the top electrode layer 1302 may, for example, be deposited by PVD, CVD, ALD, PECVD, PEALD, sputtering, or other suitable process to a thickness of 1 to 500 angstroms or a thickness of 50 to 200 angstroms. In some embodiments, the top electrode layer 1302 may comprise one or more of titanium, tantalum, tungsten, tantalum nitride (e.g., $Ta_xN_y$), titanium nitride (e.g., TiN), or the like. In other embodiments, the top electrode layer 1302 may comprise the same material as the bottom electrode layer 1102, which can be molybdenum or the like. In further embodiments, the top electrode layer 1302 may, for example, consist of or consist essentially of molybdenum.

In some embodiments, due to a nitrogen treatment, a top surface of the bottom electrode layer 1102 has a concentration of nitrogen that is higher than a concentration of nitrogen in a bottom surface of the top electrode layer 1302. Such embodiments may, for example, correspond to the embodiments of FIG. 1B.

Figure 14:
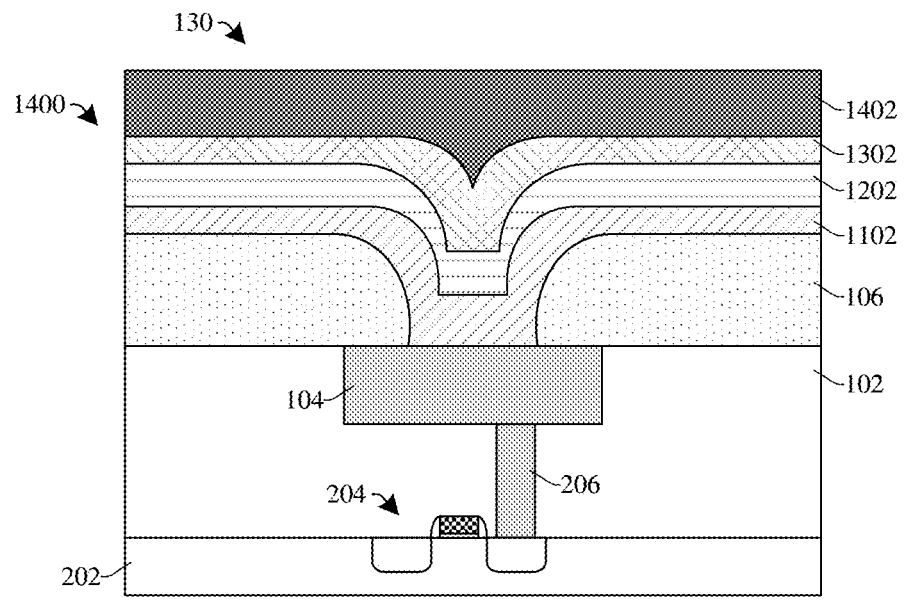

As shown in cross-sectional view 1400 of FIG. 14, a mask layer 1402 is formed over the top electrode layer 1302. In some embodiments, the mask layer 1402 can be a hard mask. In some embodiments, the mask layer 1402 may comprise a carbide (e.g., silicon carbide), a nitride (e.g., silicon nitride), an oxide (e.g., silicon oxy-nitride), or the like.

Figure 15:
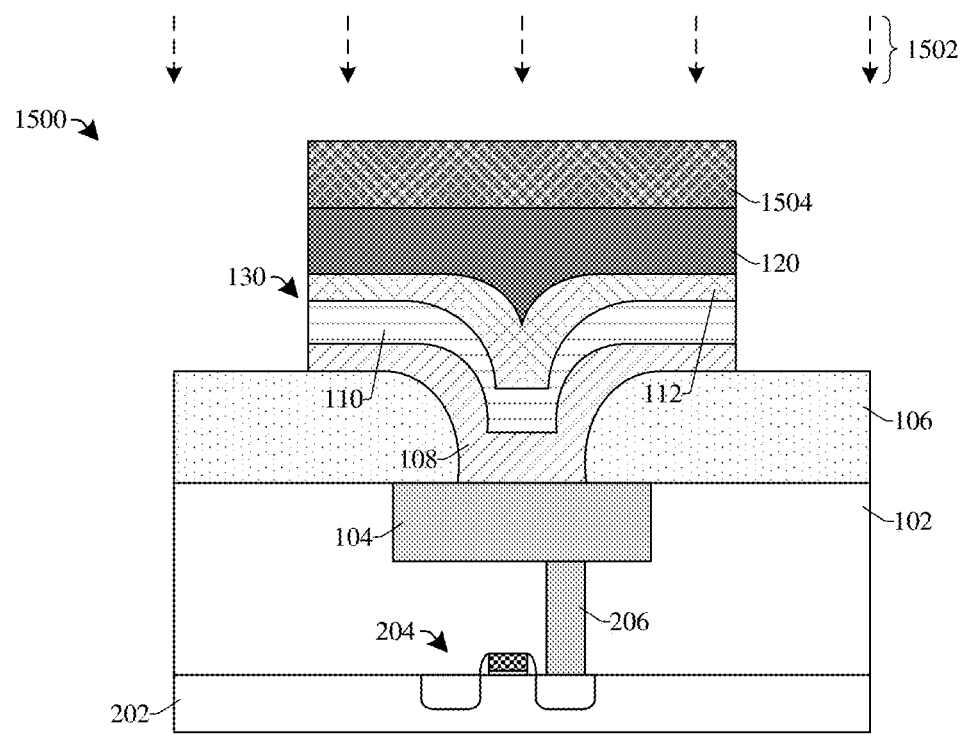

As shown in cross-sectional view 1500 of FIG. 15, a patterning process is performed to form a mask 120 over a MFM device 130 comprising a ferroelectric structure 110 between a bottom electrode 108 and a top electrode 112. In some embodiments, other than layout, the bottom electrode 108, the ferroelectric structure 110, and the top electrode 112 of the MFM device 130 are as described with regard to FIG. 1A and/or FIG. 1B. The patterning process selectively exposes the mask layer 1402 (see FIG. 14), the top electrode layer 1302 (see FIG. 14), the ferroelectric layer 1202 (see FIG. 14), and bottom electrode layer 1102 (see FIG. 14) to an etchant 1502 according to a masking layer 1504 (e.g., a photoresist material, a hard mask, or the like) to define the mask 120, the top electrode 112, the ferroelectric structure 110, and the bottom electrode 108 respectively. The patterning process forms sidewalls of the mask 120, the top electrode 112, the ferroelectric structure 110, and the bottom electrode 108 that are aligned. Subsequent to the patterning process, the masking layer 1504 is removed according to a removal process.

As such, the MFM device 130 is formed without the use of a planarization process, which may include a chemical mechanical planarization (CMP) process. The cost of using a CMP process to form one or more of the bottom electrode 108, the ferroelectric structure 110, or the top electrode 112 significantly increases a cost of forming the MFM device 130 because CMP processes are relatively expensive. In some aspects, residue of a slurry used by the CMP process may remain on the substrate 202 after a CMP process is completed. The slurry residue can accumulate over alignment marks used during lithographic processes, thereby obscuring alignment marks and causing registration errors. Thus, by forming the MFM device 130 without a CMP process, the cost of forming the MFM device 130 can be reduced while improving the photolithography process of overlying layers.

Figure 16:
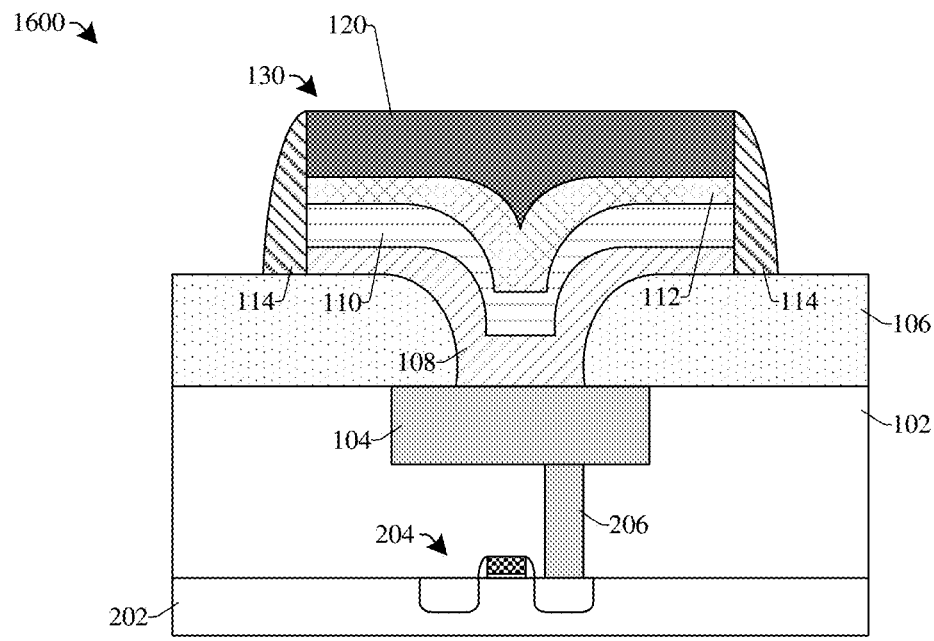

As shown in cross-sectional view 1600 of FIG. 16, a sidewall spacer 114 is formed along sidewalls of the mask 120, the top electrode 112, the ferroelectric structure 110, and the bottom electrode 108. As such, the sidewall spacer 114 is formed contacting an upper surface of the middle dielectric structure 106 and extending to an upper surface of the mask 120. In various embodiments, the sidewall spacer 114 may comprise a carbide (e.g., silicon carbide), a nitride (e.g., silicon nitride), an oxide (e.g., silicon oxy-nitride), or the like. In some embodiments, the sidewall spacer 114 may be formed by forming a spacer layer (not shown) over the substrate 202. In some embodiments, the spacer layer may be formed using a deposition technique (e.g., PVD, CVD, PE-CVD, ALD, sputtering, etc.). The spacer layer is subsequently exposed to an etchant (e.g., a dry etchant), which removes the spacer layer from horizontal surfaces. Removing the spacer layer from horizontal surfaces leaves a part of the spacer layer along opposing sides of the mask 120, the top electrode 112, the ferroelectric structure 110, and the bottom electrode 108.

Figure 17:
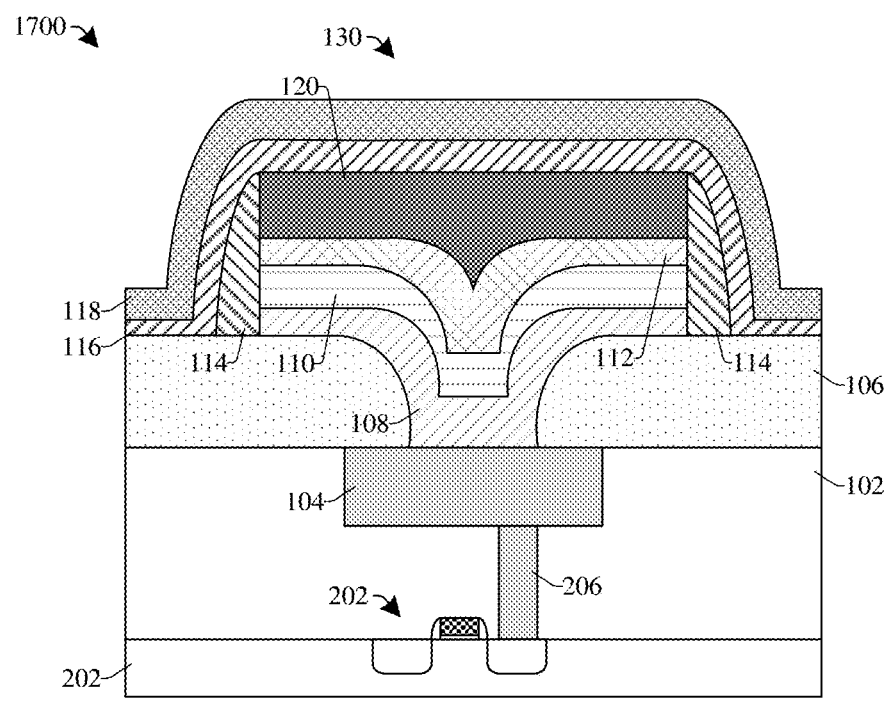

As shown in cross-sectional view 1700 of FIG. 17, an etch stop layer 116 is formed over the mask 120, the sidewall spacer 114, and the middle dielectric structure 106. Subsequently, a protective layer 118 is formed on a top surface of the etch stop layer 116. In some embodiments, the etch stop layer 116 and the protective layer 118 may, for example, be deposited by PVD, CVD, ALD, PECVD, PEALD, sputtering, or other suitable process. In some embodiments, the etch stop layer 116 may comprise silicon carbide (e.g., SiC), silicon nitride ($Si_3N_4$), titanium nitride (e.g., TiN), tantalum nitride (e.g., $Ta_xN_y$), or the like. In some embodiments, the protective layer 118 may comprise a carbide, an oxide, a nitride, TEOS oxide, or the like.

Figure 18:
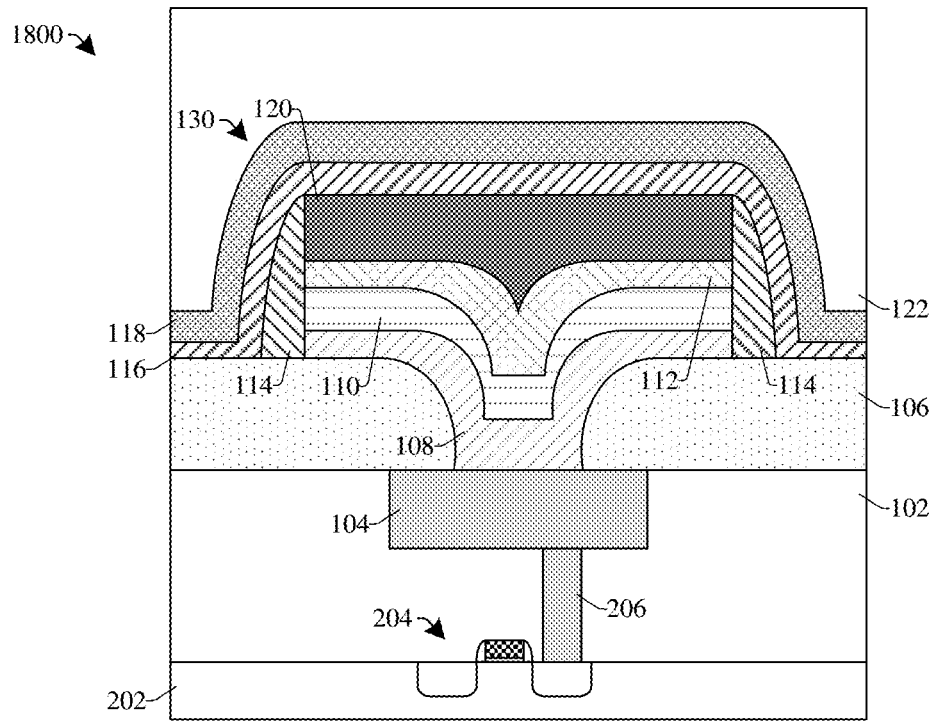

As shown in cross-sectional view 1800 of FIG. 18, an upper dielectric structure 122 is formed over the protective layer 118. The upper dielectric structure 122 is formed covering MFM device 130. In some embodiments, the upper dielectric structure 122 may be formed by a deposition process (e.g., PVD, CVD, PE-CVD, ALD, or the like). In various embodiments, the upper dielectric structure 122 may comprise silicon dioxide (e.g., $SiO_2$), doped silicon dioxide (e.g., carbon doped silicon dioxide), silicon oxynitride (e.g., $N_2OSi_2$), BSG, PSG, BPSG, FSG, a porous dielectric material, or the like.

Figure 19:
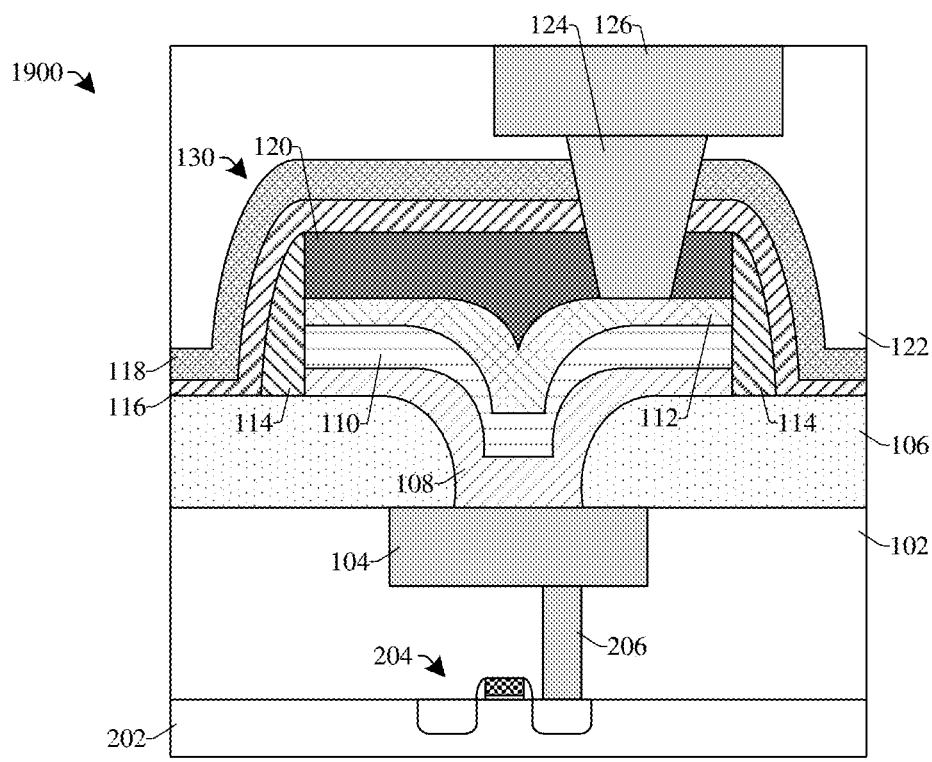

As shown in cross-sectional view 1900 of FIG. 19, an upper metal feature 126 and a conductive via 124 are formed in the upper dielectric structure 122 extending from a top surface of the upper dielectric structure 122 to a top surface of the top electrode 112. The conductive via 124 is formed offset from a midpoint of the MFM device 130. In other aspects (not shown), the conductive via 124 is formed aligned with a midpoint of the MFM device 130.

The upper metal feature 126 and conductive via 124 may be formed by selectively etching the upper dielectric structure 122 to define holes and/or trenches within the upper dielectric structure 122, forming a conductive material (e.g., copper, aluminum, etc.) within the holes and/or trenches, and performing a planarization process (e.g., a chemical mechanical planarization process). In some embodiments, the planarization process may comprise a chemical mechanical planarization (CMP) process.

By forming at least the bottom electrode 108 with a material that minimizes the formation of oxygen vacancies or traps, like molybdenum, reliability of the MFM device 130 can be enhanced. Furthermore, wakeup-free operations for the MFM device 130 can be realized, whereby a wakeup procedure and wakeup circuitry may be omitted. In various embodiments, the memory window and remanent polarization of the MFM device 130 is improved by forming the bottom electrode 108 and the top electrode 112 from molybdenum or the like.

Figure 20:
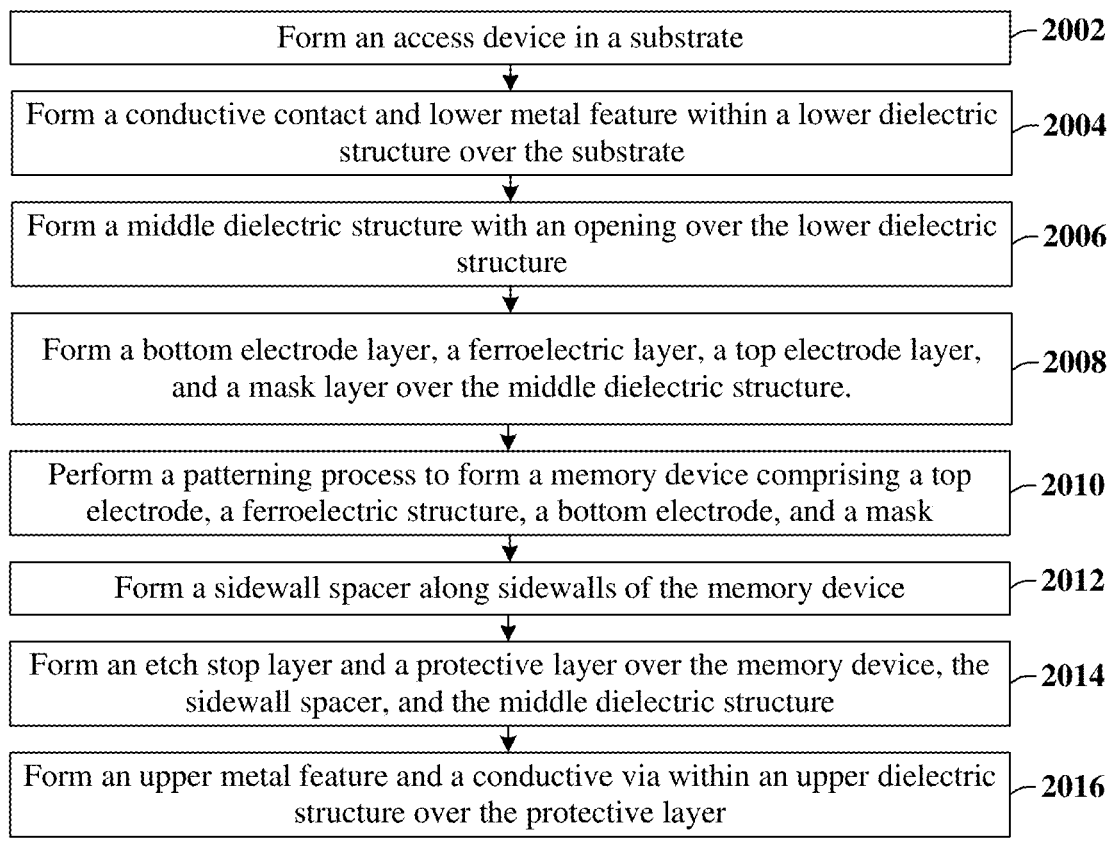
FIG. 20 illustrates a flow diagram of some embodiments of the method of FIGS. 7-19.

FIG. 20 illustrates a flow diagram of some embodiments 2000 of the method of FIGS. 7-19. While FIG. 20 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, an access device is formed within a substrate. FIG. 7 illustrates a cross-sectional view 700 of some embodiments corresponding to act 2002.

At 2004, a conductive contact and a lower metal feature are formed within a lower dielectric structure over the substrate. FIG. 8 illustrates a cross-sectional view 800 of some embodiments corresponding to act 2004.

At 2006, a middle dielectric structure is formed over the lower dielectric structure. The middle dielectric structure is patterned to define an opening extending through the middle dielectric structure. FIGS. 9-10 illustrates cross-sectional views 900-1000 of some embodiments corresponding to act 2006.

At 2008, a bottom electrode layer, a ferroelectric layer, a top electrode layer, and a mask layer are sequentially formed over the middle dielectric structure. FIGS. 11-14 illustrates cross-sectional views 1100-1400 of some embodiments corresponding to act 2008.

At 2010, perform a patterning process on the mask layer, the top electrode layer, the ferroelectric layer, and the bottom electrode layer to form a mask over a memory device comprising a top electrode, a ferroelectric structure, and a bottom electrode. FIG. 15 illustrates a cross-sectional view 1500 of some embodiments corresponding to act 2010.

At 2012, form a sidewall spacer along sidewalls of the mask and the memory device. FIG. 16 illustrates a cross-sectional view 1600 of some embodiments corresponding to act 2012.

At 2014, form an etch stop layer and a protective layer over the memory device, the sidewall spacer, and the middle dielectric structure. FIG. 17 illustrates a cross-sectional view 1700 of some embodiments corresponding to act 2014.

At 2016, an upper metal feature and a conductive via are formed within an upper dielectric structure over the protective layer, where the upper metal feature and the conductive via are coupled to the memory device. FIGS. 18-19 illustrates cross-sectional views 1800-1900 of some embodiments corresponding to act 2016.

Accordingly, in some embodiments, the present disclosure relates to a method of forming a semiconductor structure having memory device with a bottom electrode, a ferroelectric structure, and a top electrode that form a wakeup-free ferroelectric memory device.

In various embodiments, the present application provides a ferroelectric memory device including: a bottom electrode; a ferroelectric structure overlying the bottom electrode; and a top electrode overlying the ferroelectric structure, where the bottom electrode comprises molybdenum.

In various embodiments, the present application provides a semiconductor structure including: a semiconductor substrate; an access device overlying and partially formed by the semiconductor substrate; an interconnect structure overlying and electrically coupled to the access device, where the interconnect structure includes an alternating stack of metal layers and via layers; a metal-ferroelectric-metal (MFM) device in the interconnect structure, vertically between a pair of neighboring metal layers of the alternating stack, where the MFM device comprises a bottom electrode, a top electrode, and a ferroelectric structure between the bottom and top electrodes; and where the bottom electrode has a lesser reactivity with oxygen than the top electrode and includes a nitrogen-rich layer extending along a top surface of the bottom electrode, where the nitrogen-rich layer has an elevated concentration of nitrogen relative to a remainder of the bottom electrode.

In various embodiments, the present application provides a method of forming a semiconductor structure, including: depositing a bottom electrode layer; depositing a ferroelectric layer overlying the bottom electrode layer; depositing a top electrode layer overlying the ferroelectric layer; patterning the bottom electrode layer, the top electrode layer, and the ferroelectric layer to form a metal-ferroelectric-metal (MFM) device; and where the bottom electrode layer is deposited as a material comprising molybdenum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   depositing a bottom electrode layer;
   performing a nitrogen treatment process on a top surface of the bottom electrode layer;
   depositing a ferroelectric layer overlying the bottom electrode layer;
   depositing a top electrode layer overlying the ferroelectric layer;
   patterning the bottom electrode layer, the top electrode layer, and the ferroelectric layer to form a metal-ferroelectric-metal (MFM) device; and
   wherein the top surface of the bottom electrode layer is formed with an elevated concentration of nitrogen relative to a top surface of the top electrode layer.

2. The method according to claim 1, wherein the bottom electrode layer is predominantly molybdenum.

3. The method according to claim 1, further comprising:
   forming an interconnect structure overlying a substrate, wherein the interconnect structure comprises a metal feature;
   depositing a dielectric layer covering the metal feature; and
   patterning the dielectric layer to form a via opening exposing the metal feature; and
   wherein the bottom electrode layer is deposited lining the via opening.

4. The method of claim 1, further comprising:
   performing a nitrogen treatment process to the top electrode layer.

5. The method of claim 1, further comprising: performing an annealing process on the top surface of the bottom electrode layer.

6. The method of claim 1, wherein the top electrode layer comprises molybdenum.

7. The method of claim 1, wherein the top surface of the bottom electrode layer is formed with an elevated concentration of nitrogen relative to a bottom surface of the top electrode layer.

8. A method of forming a metal-ferroelectric-metal (MFM) device, comprising:
   depositing a bottom electrode layer on a dielectric structure;
   depositing a ferroelectric layer on the bottom electrode layer;
   depositing a top electrode layer on the ferroelectric layer;
   performing a nitrogen treatment process on a top surface of the top electrode layer;
   forming a bottom electrode, a top electrode, and a ferroelectric structure from the bottom electrode layer, the top electrode layer, and the ferroelectric layer; and
   wherein a top surface of the bottom electrode layer is formed with an elevated concentration of nitrogen relative to a bottom surface of the bottom electrode.

9. The method of claim 8, wherein one or more of the top electrode layer or the bottom electrode layer comprise molybdenum or a molybdenum compound.

10. The method of claim 9, wherein the ferroelectric layer is deposited as a material comprising a binary oxide, a ternary oxide, or a quaternary oxide.

11. The method of claim 8, further comprising:
    performing a nitrogen treatment process on one or more of the bottom electrode layer or the top electrode layer.

12. The method of claim 8, wherein the top surface of the bottom electrode layer is formed with an elevated concentration of nitrogen relative to a top surface of the top electrode.

13. The method of claim 8, wherein the top surface of the bottom electrode layer is formed with an elevated concentration of nitrogen relative to a bottom surface of the top electrode layer.

14. The method of claim 8, wherein the top electrode and the bottom electrode are formed with a width greater than 500 angstroms.

15. The method of claim 8, wherein the top electrode and the bottom electrode are formed with a thickness between 1 angstroms and 500 angstroms.

16. A method of forming a semiconductor structure, comprising:
    forming an access device in a substrate;
    forming a conductive contact coupled to the access device and a lower metal feature coupled to the conductive contact within a lower dielectric structure over the substrate;
    forming a middle dielectric structure over the lower dielectric structure, wherein the middle dielectric structure is formed with an opening that exposes the lower metal feature;
    forming a bottom electrode layer within the opening, wherein the bottom electrode layer is formed with molybdenum;
    forming a ferroelectric layer on the bottom electrode layer;
    forming a top electrode layer on the ferroelectric layer;
    performing a patterning process on the bottom electrode layer, ferroelectric layer, and the top electrode layer, to respectively form a bottom electrode, ferroelectric structure, and a top electrode, wherein the bottom electrode is coupled to the access device through the conductive contact; and
    wherein a top surface of the bottom electrode is formed with an elevated concentration of nitrogen relative to a bottom surface of the top electrode.

17. The method of claim 16, wherein the bottom electrode is formed with a nitrogen-rich layer extending along the top surface of the bottom electrode, wherein the nitrogen-rich layer has an elevated concentration of nitrogen relative to a remainder of the bottom electrode.

18. The method of claim 16, wherein the bottom electrode comprises 80% or more molybdenum by mass.

19. The method of claim 16, wherein a crystal structure and directional lattice constant of the bottom electrode layer is matched to a crystal structure and directional lattice constant of the ferroelectric layer.

20. The method of claim 16, wherein the top surface of the bottom electrode is formed with an elevated concentration of nitrogen relative to a top surface of the top electrode.

* * * * *